(12) United States Patent
Varma et al.

(10) Patent No.: US 7,492,839 B2
(45) Date of Patent: Feb. 17, 2009

(54) EFFICIENT IMPLEMENTATION OF GSM/GPRS EQUALIZER

(75) Inventors: Gottimukkala Narendra Varma, Andhra Pradesh (IN); Garapati Prabhu Charan, Andhra Pradesh (IN); Jinuga Preetham, Andhra Pradesh (IN); Gadesina Venkateswarlu, Andhra Pradesh (IN)

(73) Assignee: Hellosoft Inc., San Jose, CA (US)

( * ) Notice: Subject to any disclaimer, the term of this patent is extended or adjusted under 35 U.S.C. 154(b) by 740 days.

(21) Appl. No.: 10/909,232

(22) Filed: Jul. 30, 2004

(65) Prior Publication Data

US 2006/0023814 A1 Feb. 2, 2006

(51) Int. Cl.
*H03D 1/00* (2006.01)
*H04L 27/06* (2006.01)

(52) U.S. Cl. .................. 375/341; 375/262; 375/336; 375/348; 714/795; 714/796

(58) Field of Classification Search .................. 375/341, 375/262, 265, 336, 348, 231; 714/795, 796, 714/794
See application file for complete search history.

(56) References Cited

U.S. PATENT DOCUMENTS 5,488,635 A * 1/1996 Chennakeshu et al. ...... 375/340
5,825,832 A * 10/1998 Benedetto .................... 375/341
5,905,757 A 5/1999 Kundmann
5,995,562 A * 11/1999 Koizumi ...................... 375/341
7,017,104 B1 * 3/2006 Chen et al. ................... 714/796
7,222,288 B2 * 5/2007 Varma et al. ................. 714/795

FOREIGN PATENT DOCUMENTS

EP 01246418 A2 10/2002

* cited by examiner

*Primary Examiner*—Phuong Phu
(74) *Attorney, Agent, or Firm*—William L. Botjer

(57) ABSTRACT

The disclosed invention provides a method, a system and a computer program product for the maximum likelihood sequence estimation of transmitted MSK symbols. The disclosed invention provides a set of optimizations of the Viterbi algorithm for equalizing MSK symbols. The transmitted MSK symbols are alternately real and imaginary. Therefore, based on whether the transmitted MSK symbol is real or imaginary, the disclosed invention divides the set of Viterbi states into two sets of states. The disclosed invention obtains the surviving path only for the first set of states at stages corresponding to real transmitted symbols. A real hypothesis is used to obtain the surviving paths for the first set of states. The disclosed invention also obtains the surviving path only for the second set of states at stages corresponding to imaginary transmitted symbols. An imaginary hypothesis is used to obtain the surviving paths of the second set of states. Therefore, the Viterbi trellis is advanced by considering only half the number of Viterbi states at each stage, leading to computational efficiency.

27 Claims, 14 Drawing Sheets

EFFICIENT IMPLEMENTATION OF GSM/GPRS EQUALIZER

BACKGROUND

The disclosed invention relates to the equalization of a received signal at a wireless receiver in a wireless communication system. More specifically, the disclosed invention relates to an optimized implementation of a Viterbi equalizer for estimating a Minimum Shift Keying (MSK) modulated signal.

In wireless communication, the transmission channel introduces Inter Symbol Interference (ISI) in the received signal. An equalizer is used at the wireless receiver to estimate the transmitted signal in the presence of ISI. A method of equalization, known as maximum likelihood sequence estimation (MLSE), determines the sequence of symbols that is most likely to have been transmitted by the transmitter. MLSE is commonly used in wireless receivers such as Gaussian Minimum Shift Keying (GMSK) receivers used in the Global System for Mobile communication (GSM) systems. MLSE equalizers use an algorithm known as the Viterbi algorithm to estimate the maximum likelihood sequence.

The Viterbi algorithm estimates the maximum likelihood transmitted signal at the wireless receiver, using the prior knowledge of the received signal, the channel impulse response, and the possible values of transmitted symbols. In order to use the knowledge of the possible values of the transmitted symbols, the MLSE equalizer is implemented as a state machine. The possible states of the equalizer are based on the possible values of the previous L transmitted symbols, where L is the length of the inter symbol interference introduced in the channel. Further, the state transition of the equalizer at a stage is decided by using the channel impulse response and the symbol received at that stage. To efficiently use the information available with the wireless receiver, the Viterbi algorithm uses a Viterbi trellis to represent the states and state transitions of the equalizer. The maximum likelihood sequence of the transmitted symbols is estimated by traversing the Viterbi trellis and determining a set of maximum likelihood state transitions at each stage.

Referring now primarily to FIG. 1, the Viterbi trellis for stages n and n+1 is hereinafter described. A set 102 of the previous L transmitted symbols define the Viterbi state at stage n. Similarly, a set 104 of the previous L transmitted symbols define the Viterbi state at stage n+1. Assuming two possible values $\{p_1, p_2\}$ of the transmitted symbol, $2^L$ Viterbi states are possible at a stage. These Viterbi states are shown as $\{S_1, S_2, \ldots, S_{2^L}\}$. Further, a Viterbi state set $S=\{S_1, S_2, \ldots, S_{2^L}\}$ comprises all possible Viterbi states at a stage. A possible state transition is hereinafter referred to as a branch. In a Viterbi trellis, two branches originate from each Viterbi state at a stage. Each of these branches corresponds to a possible value of the transmitted symbol. For example, branches 106 and 110, originating from Viterbi state $S_1$ at stage n, correspond to the transmitted symbols $p_1$ and $p_2$ respectively. Further, two branches lead to each state at a stage. For example, branches 106 and 108 lead to Viterbi state $S_1$ at stage n+1. A series of branches (state transitions) is hereinafter referred to as a path.

The Viterbi algorithm uses the Viterbi trellis to estimate the most likely sequence of transmitted symbols. The Viterbi algorithm involves performing a set of steps for each stage, hereinafter referred to as advancing the Viterbi trellis by a stage. The steps involve determining one surviving path leading to each Viterbi state at the stage and taking a decision regarding a symbol at a finite number of stages N preceding the current stage. After the Viterbi trellis has been advanced by a stage, only one path for each Viterbi state at the stage survives. Therefore, only two possible paths leading to each Viterbi state at the subsequent stage remain. For example, paths 112 and 114 survive for Viterbi states $S_1$ and $S_2$ at stage n−1. Correspondingly, two paths leading to Viterbi state $S_1$ remain at stage n. Once the surviving paths are determined at stage n, a decision is taken regarding a symbol at a finite number of stages N preceding stage n. The method of determining surviving paths and taking the decision is repeated at each stage of the Viterbi trellis to estimate a maximum likelihood sequence of symbols. The method of determining surviving paths is described with reference to FIG. 2. Further, the method of estimating the maximum likelihood sequence of symbols is described with reference to FIG. 3.

Referring now primarily to FIG. 2, the method of determining surviving paths for stage n, is hereinafter described. At step 202, the received signal is convolved with the conjugate of the time-inverted channel to obtain a symbol $y_n$ representing the received symbol at stage n. Thereafter, the first Viterbi state from Viterbi state set S is considered as state $S_k$ at step 204. Two possible paths lead to Viterbi state $S_k$ at a stage n+1. At step 206, a path metric for the first possible path, leading to Viterbi state $S_k$ at stage n+1, is obtained using the relation $$CM_n(I_n, S_k) = CM_{n-1}(I_{n-1}, S_{k'}) + 2\mathcal{R}\{I_n * y_n\} - 2\mathcal{R}\left\{I_n * \sum_{m=1}^{L} I_{n-m} * x_m\right\} - |I_n|^2 x_0 \qquad (1)$$

where $I_n$ denotes the transmitted symbol at stage n, $S_{k'}$ is the Viterbi state on the first possible path at stage n, $CM_n(I_n, S_k)$ is the path metric of a possible path leading to Viterbi state $S_k$ at stage n+1, as obtained at stage n, $CM_{n-1}(I_{n-1}, S_{k'})$ is the path metric of the surviving path leading to stage $S_{k'}$ at stage n, as obtained at stage n−1, set $\{I_{n-m}, m \in [1,L], m \in I\}$ correspond to Viterbi state $S_k$, and $x_m$ is the autocorrelation value of the channel impulse response for the time delay of m stages. At step 208, the path metric for the second possible path is similarly obtained. At step 210, the path with a higher path metric among the above two paths is selected as the surviving path for Viterbi state $S_k$ at stage n+1. At step 212, it is checked whether Viterbi state $S_k$ is the last state of Viterbi state set S. If the Viterbi state $S_k$ is not found to be the last Viterbi state, then the next state from Viterbi state set S is considered as state $S_k$ at step 214. Steps 206, 208 and 210 are then repeated for the new state $S_k$. Therefore, the surviving paths leading to all the states of Viterbi state set S is determined at stage n.

Referring now primarily to FIG. 3, the method of estimating the maximum likelihood sequence of symbols, is hereinafter described. The stage of the Viterbi trellis corresponding to the first symbol to be equalized is considered as stage n, at step 302. At step 304, the Viterbi trellis is then advanced by stage n, in accordance with the method described with reference to FIG. 2. Therefore, step 304 obtains $2^L$ surviving paths, each corresponding to a Viterbi state. Thereafter, the path with the highest path metric is selected from these surviving paths as a maximum likelihood (ML) path at stage n at step 306. At step 308, a trace back along the ML path by a finite number of stages N is performed. A series of branches at multiple stages constitute a path. In addition, a branch at a stage corresponds to a state transition, which, in turn, corresponds to a symbol at that stage. Therefore, a path corresponds to a series of symbols. Therefore, step 308 of tracing back determines the symbols at previous stages along the ML path. At step 310, the symbol determined at stage n−N by tracing back is established as the symbol transmitted at stage n−N. At step 312, it is verified whether stage n is the last stage to be equalized. If stage n is not found to be the last stage to be equalized, then the next stage is considered to be stage n at step 314. Steps 304 to 310 are then repeated for the new stage n. Therefore, a sequence of transmitted symbols is estimated by the above method.

An implementation of an MLSE equalizer is disclosed in EPO Patent Application No. EP01246418A2, publication date Oct. 2, 2002, titled "Hybrid Equalizer With Feedback And Sequence Estimation", to Broadcom Corporation. The disclosed implementation combines the benefits of a decision feedback equalizer (DFE) with a maximum-a-posterori (MAP) equalizer (or a maximum likelihood sequence estimator, MLSE) to perform equalization in a time-forward or time-reversed manner. The selection of the time-forward or time-reversed manner is based on the channel being minimum phase or maximum phase. The disclosed equalization device has lower complexity than a full-state MAP device.

Another equalizer, which exploits the alternate real and imaginary nature of the received signal, is disclosed in U.S. Pat. No. 5,905,757, publication date May 18, 1999, titled "Filter Co-processor", to Motorola, Inc. The patent discloses a filter co-processor within a Digital Signal Processor (DSP) that takes advantage of the orthogonal nature of the modulated signals during the equalization process. Since after reception, only certain real/imaginary values of the received signal are useful for demodulation, the filter co-processor only processes those values to estimate the transmitted signal. By processing only those values useful for demodulation, the filter co-processor is able to process more information in a given amount of time, leading to increased processing when compared to the prior art.

Both the aforementioned equalizers exploit certain redundancies in MLSE equalization to reduce the complexity of the equalization process. However, both the above implementations exploit only some of the redundancies inherently present in the MLSE equalization. There are many redundancies in the MLSE equalization computation that these implementations fail to exploit. Further, most mobile receivers, such as MSK receivers, have limited processing power and memory resources. Therefore, there is a need for a more efficient implementation of an MLSE equalizer that exploits all the redundancies inherent in the computations of the MLSE equalization.

SUMMARY

The disclosed invention is directed towards a method, a system and a computer program product for the maximum likelihood sequence estimation of transmitted MSK symbols at a wireless receiver.

An objective of the disclosed invention is to estimate the maximum likelihood sequence of transmitted MSK symbols with increased efficiency.

A further objective of the disclosed invention is to provide an efficient implementation of the Viterbi algorithm equalizing MSK symbols.

Another objective of the disclosed invention is to reduce the memory requirements of the Viterbi algorithm equalizing MSK symbols.

Yet another objective of the disclosed invention is to increase the efficiency of the equalization of a burst-based signal.

Still another objective of the disclosed invention is to equalize a burst-based signal with increased accuracy.

The above-mentioned and other objectives of the disclosed invention are achieved by providing an implementation of the Viterbi algorithm that exploits the properties of the MSK modulation. MSK-modulated symbols can take four possible values namely $\{+1,-1,+j,-j\}$. In the Viterbi algorithm, wherein a symbol can take four possible values, a memory of L symbols results in $4^L$ Viterbi states. However, only $2^L$ of these states are possible at a given stage, since the MSK modulated symbols are alternately real and imaginary and also the initial state is known. The Viterbi equalizer provided by the disclosed invention operates in accordance with a real hypothesis at the stages corresponding to which the transmitted symbol is real; and in accordance with an imaginary hypothesis at the stages corresponding to which the transmitted symbol is imaginary. The Viterbi states are divided into two sets of states, depending on the corresponding transmitted symbol being real or imaginary. In accordance with the real hypothesis, the surviving paths are computed only for the first of these sets. Further, in accordance with the imaginary hypothesis, the surviving paths are computed for the second of these sets. Thereafter, the maximum likelihood (ML) path is selected from the surviving paths. A decision regarding at least one previous symbol is taken based on the ML path. Therefore, the computational complexity of the Viterbi algorithm is reduced by determining the surviving path for half the number of Viterbi states at each stage. Further, the memory required for storing the path metric of the surviving path is reduced, since the number of surviving paths is reduced by a factor of two.

Further, the ISI terms required for computing the path metric at a stage are pre-computed for all the Viterbi states. The autocorrelation values of the channel impulse response are required for pre-computing the ISI terms. The channel impulse response and the autocorrelation values are complex. However, because of the MSK nature of the transmitted symbols, only real parts of the complex autocorrelation values corresponding to the time delay of even stages are required. Also, only imaginary parts of the complex autocorrelation values corresponding to the time delay of odd stages are required. The method, in accordance with the disclosed invention, obtains only the required parts of the complex autocorrelation values during pre-computation. Therefore, the computational complexity of the pre-computation is also reduced.

In an embodiment of the disclosed invention, the above method is used to equalize symbols of a data burst, which comprises a training sequence in the midamble. The symbols of the training sequence are known to the wireless receiver. Therefore, only the two sets of data symbols, preceding and following the midamble, are equalized. The set of data symbols following the midamble are equalized by advancing the Viterbi trellis in a forward time direction. However, the set of data symbols preceding the midamble are equalized by advancing the Viterbi trellis in a backward time direction. Further, the estimated ISI terms, pre-computed for the Viterbi trellis corresponding to the forward time direction, are reused for advancing the Viterbi trellis in a backward time direction. High efficiency is achieved in equalization, since the equalization of the training sequence is avoided, and the pre-computed ISI terms are reused.

The disclosed method, system and computer program product achieves the efficient equalization of the transmitted MSK symbols at the wireless receiver. Since the MSK properties of the transmitted symbols are exploited by the disclosed invention, differential decoding is not required for equalization. Also, the effective number of Viterbi states is reduced by a factor of two, since the real and imaginary hypothesis is used for the first and second set of states, respectively. Therefore, the memory required for storing the path metric information is reduced. The pre-computation of the estimated ISI terms further increases the efficiency of the equalization process, without affecting the accuracy. Additionally, the forward and backward advancement of the Viterbi trellis for the first and second data sets, respectively, results in better efficiency since the equalization of the training sequence is avoided, and the pre-computation of the estimated ISI term is reused for advancing the Viterbi trellis in the backward time direction. Therefore, the disclosed invention provides an efficient equalization process for MSK symbols.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which.

DESCRIPTION OF PREFERRED EMBODIMENTS

The disclosed invention provides a method, a system and a computer program product for estimating a transmitted MSK symbol at a wireless receiver. The disclosed invention provides a set of optimizations of the Viterbi algorithm for estimating transmitted MSK symbols. The optimizations are based on the properties of the MSK modulation and increase the efficiency of the Viterbi algorithm. The symbols of the MSK-modulated signals are alternately real and imaginary. Exploiting this aspect of MSK modulation, the computations involved in the Viterbi algorithm are split into two sets. These two sets of computations are performed at alternate stages of the Viterbi algorithm. Further, certain pre-computations, based on the MSK modulation, are suggested to increase the efficiency of the Viterbi algorithm.

Figure 1:
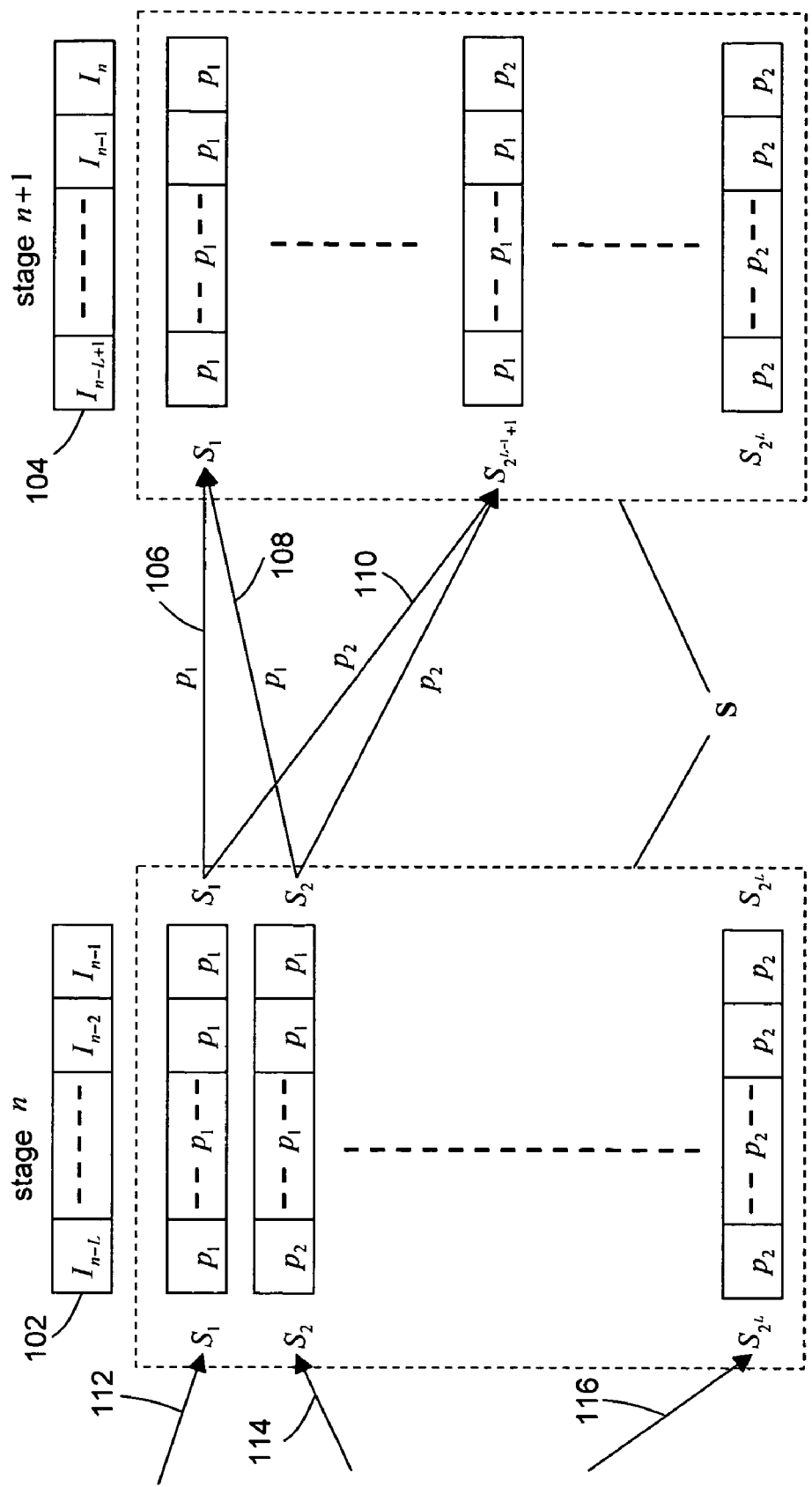
FIG. 1 is a block diagram illustrating the Viterbi trellis, in accordance with the prior art.
Figure 2:
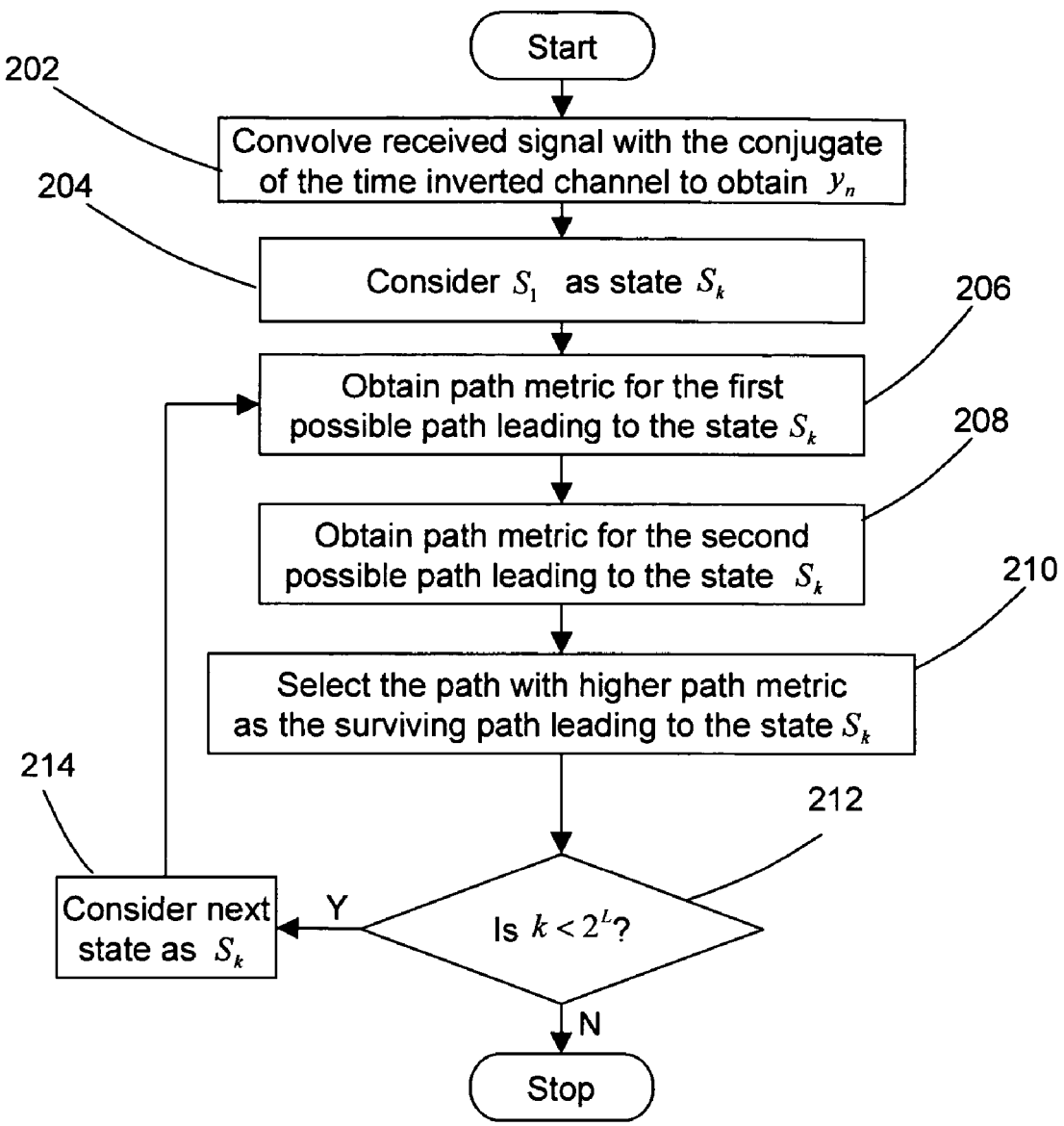
FIG. 2 is a flowchart illustrating the prior art method of determining surviving paths at a stage.
Figure 4:
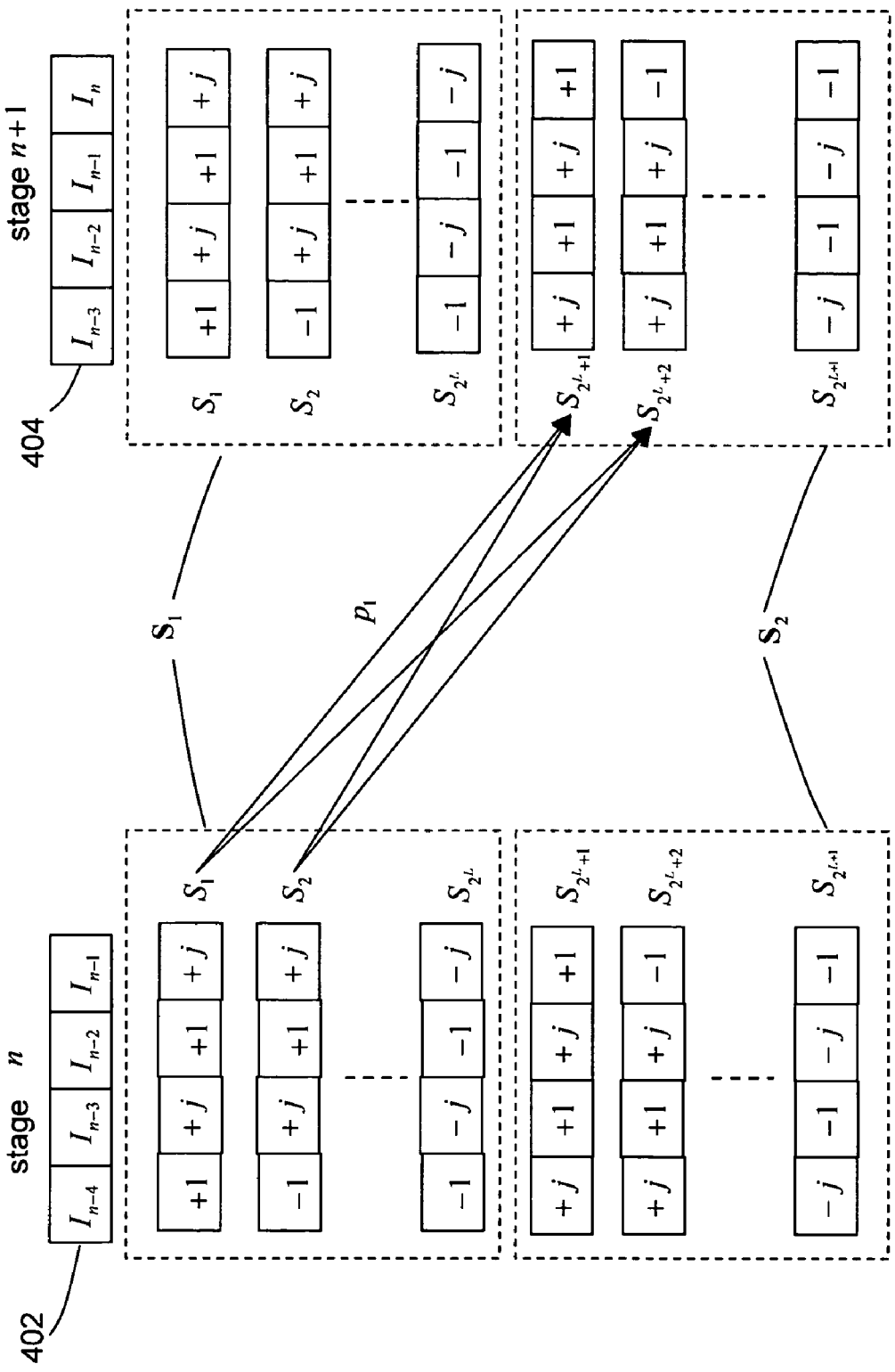
FIG. 4 is a block diagram illustrating the Viterbi trellis for stages n and n+1 for transmitted MSK symbols, in accordance with the disclosed invention.

Referring now primarily to FIG. 4, the Viterbi trellis for stages n and n+1 corresponding to MSK symbols, in accordance with the disclosed invention, is hereinafter described. For the following description, the value of L is assumed to be 4. The value of L, assumed to be 4 for illustrating the invention, in no way limits the scope of the invention, which can be implemented with any other value of L. Further, the transmitted symbol at stage n is assumed to be real. As discussed with reference to FIG. 1, a set 402 of the previous L transmitted symbols define the Viterbi state at a stage. An MSK-modulated symbol can take four values given by the set $\{+1,-1,+j,-j\}$. However, the MSK symbols are alternately real and imaginary. Therefore, one symbol can take only two values at a stage, i.e., a symbol can take a value either from the set $\{+1,-1\}$ or from the set $\{+j,-j\}$. Therefore, the number of Viterbi states is equal to $2^{L+1}$. These Viterbi states are shown as $\{S_1, sS_2, \ldots, S_{2^{L+1}}\}$. Since at stage n, the transmitted symbol is real, the Viterbi states having imaginary values of the previous symbol $I_{n-1}$ are possible. These Viterbi states are considered as a first set of states $S_1$. Further, at stage n+1, the previous symbol $I_n$ is real, and therefore, the Viterbi states having real values of the previous symbol are possible. These Viterbi states are considered as a second set of states $S_2$. Therefore, all branches at stage n, corresponding to a real symbol, lead to a state in second set of states $S_2$. Similarly, the branches at a stage corresponding to imaginary transmitted symbols lead to a state in first set of states $S_1$. Therefore, though the number of Viterbi states is $2^{L+1}$, only $2^L$ Viterbi states are possible at one stage.

A method, in accordance with the disclosed invention, advances the Viterbi trellis described with reference to FIG. 4. For this Viterbi trellis, equation (1) set forth above, is calculated, using two hypotheses. A real hypothesis is used for the stages corresponding to real transmitted symbols, and an imaginary hypothesis is used for the stages corresponding to imaginary transmitted symbols. Therefore, the real hypothesis is used for the states in first set of states $S_1$ and the imaginary hypothesis is used for the states in second set of states $S_2$. In accordance with the real hypothesis, equation (1) can be expressed as $$CM_n(I_n, S_k) = \quad (2)$$

$$CM_{n-1}(I_{n-1}, S_{k'}) + 2\mathcal{R}\{I_n\} * \mathcal{R}\{y_n\} - 2\mathcal{R}\left\{I_n * \sum_{m=1}^{L} I_{n-m} * x_m\right\} - |I_n|^2 x_0$$

Further, in accordance with the imaginary hypothesis, equation (1) can be expressed as $$CM_n(I_n, S_k) = \quad (3)$$

$$CM_{n-1}(I_{n-1}, S_{k'}) + 2\mathcal{I}\{I_n\} * \mathcal{I}\{y_n\} - 2\mathcal{R}\left\{I_n * \sum_{m=1}^{L} I_{n-m} * x_m\right\} - |I_n|^2 x_0$$

Therefore, either the real or imaginary part of the symbol $y_n$ representing the received symbol at a stage are required, depending on whether the transmitted symbol at the stage is real or imaginary. The real part of the symbol $y_n$ is hereinafter referred to as a real component $\Re\{y_n\}$ representing the received signal at stage n. Additionally, the imaginary part of the symbol $y_n$ is hereinafter referred to as an imaginary component $\Im\{y_n\}$ representing the received signal at stage n.

It can further be observed that the third term $$2\Re\left\{I_n * \sum_{m=1}^{L} I_{n-m} * x_m\right\}$$

of equation (1), hereinafter referred to as the estimated ISI term, can be pre-computed for all possible combinations of the set $\{I_n, I_n-1, I_n-2, \ldots, I_{n-L}\}$. Also, the alternate symbols in the set $\{I_n, I_{n-1}, I_{n-2}, \ldots, I_{n-L}\}$ are real and imaginary. Therefore, only the real part of the complex autocorrelation values $\{x_2, x_4, \ldots\}$ of the channel impulse response, corresponding to the time delay of an even number of stages, are required for calculating the estimated ISI term. Similarly, only imaginary parts of the complex autocorrelation values $\{x_1, x_3, \ldots\}$ of the channel impulse response, corresponding to the time delay of the odd number of stages, are required for calculating the estimated ISI term. For example, for an ISI of 4 symbols, the estimated ISI terms for the first set of states $S_1$ according to the real hypothesis, is calculated as $$2\Re\left\{I_n * \sum_{m=1}^{L} I_{n-m} * x_m\right\} = \quad (4)$$

$$b_n(-b_{n-1}\Im\{x_1\} + b_{n-2}\Re\{x_2\} - b_{n-3}\Im\{x_3\} + b_{n-4}\Re\{x_4\})$$

where $b_n=|I_n|$, $\Re\{x_m\}$ represents the real part of $x_m$, and $\Im\{x_m\}$ represents the imaginary part of $x_m$. Also, the estimated ISI terms for the second set of states $S_2$, according to the imaginary hypothesis, is calculated as $$2\Re\left\{I_n * \sum_{m=1}^{L} I_{n-m} * x_m\right\} = \quad (5)$$

$$b_n(-b_{n-1}\Im\{x_1\} + b_{n-2}\Re\{x_2\} - b_{n-3}\Im\{x_3\} + b_{n-4}\Re\{x_4\})$$

Figure 5A:
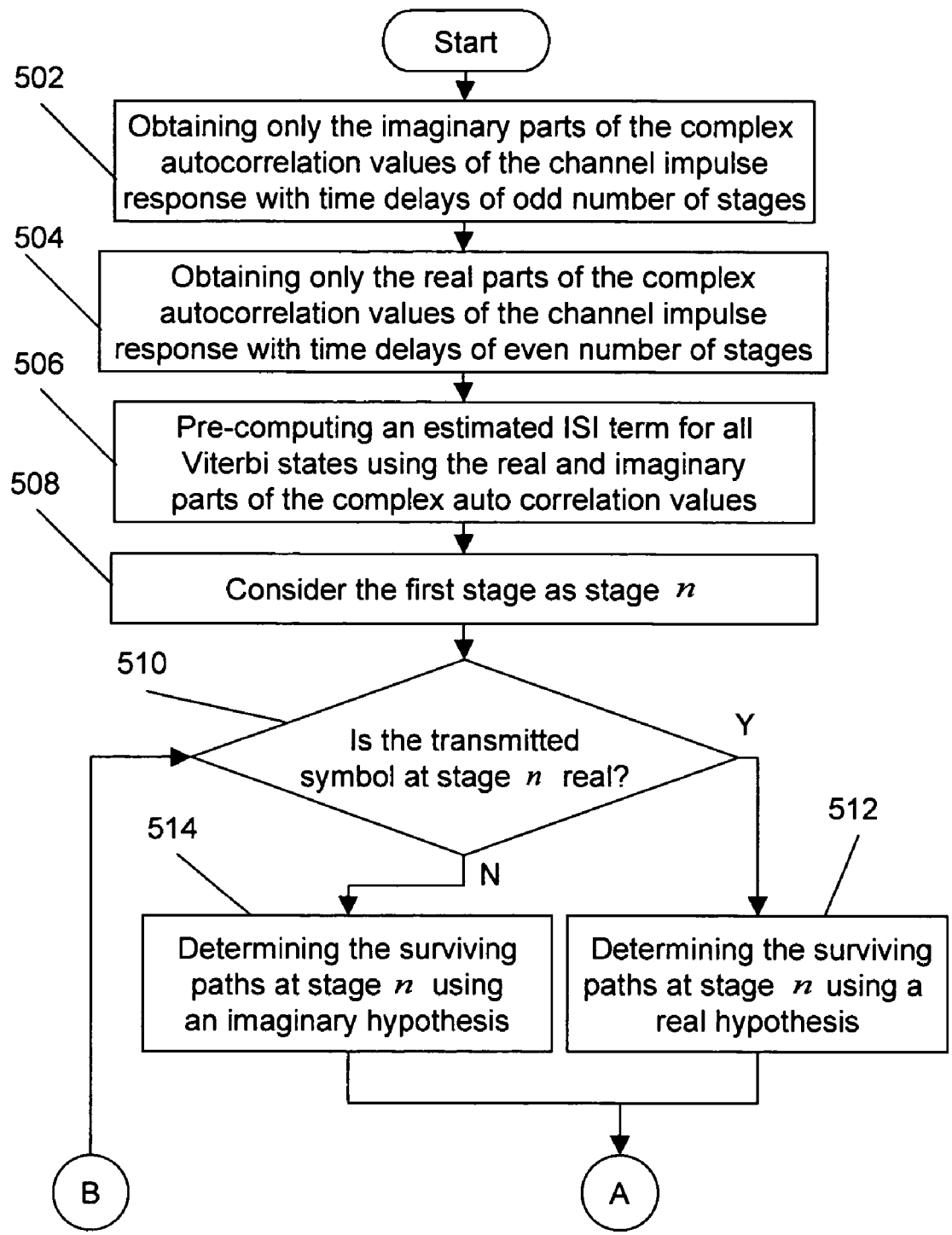
FIG. 5 is a flowchart illustrating a method of estimating a sequence of transmitted symbols, in accordance with the disclosed invention.
Figure 5B:
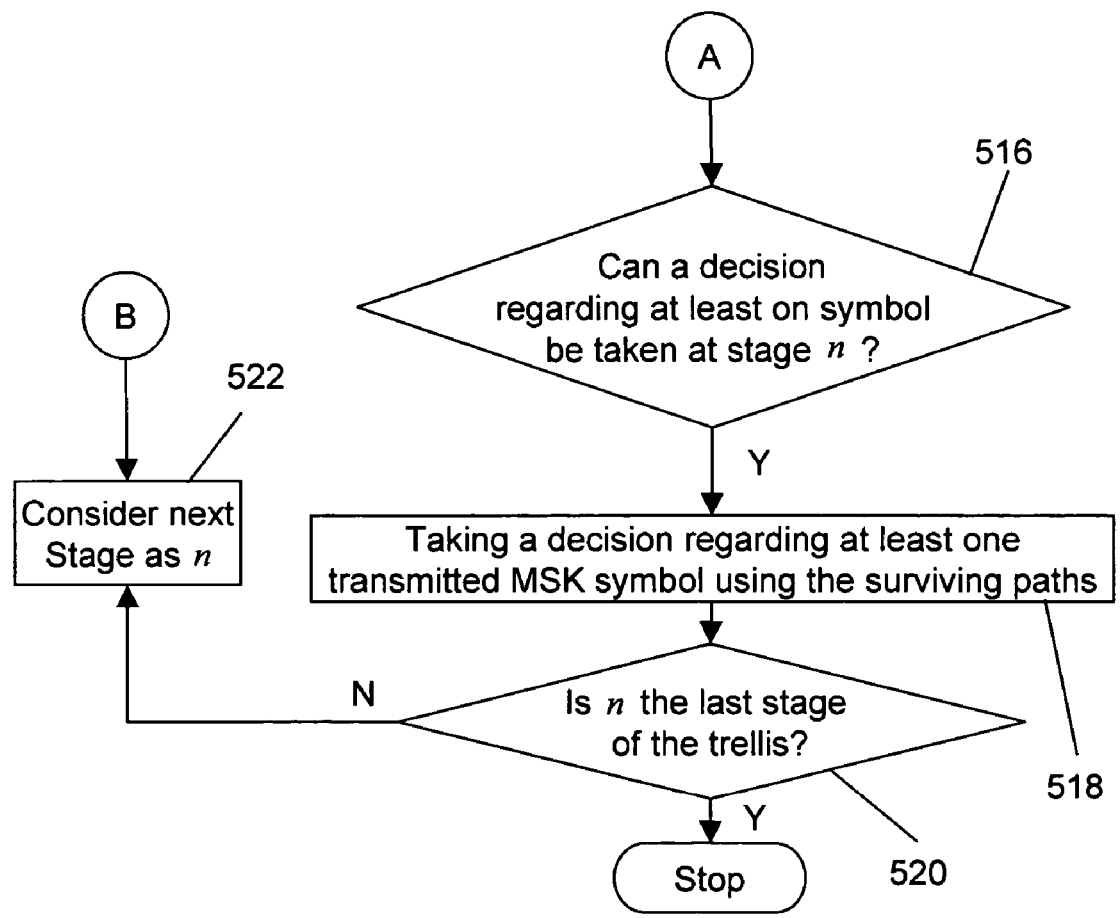

Referring now primarily to FIG. 5A and FIG. 5B, the method of estimating a sequence of transmitted symbols, in accordance with the disclosed invention, is hereinafter described. At step 502, only imaginary parts $\{\Im\{x_1\}, \Im\{x_3\}, \ldots\}$ of the complex autocorrelation values of the channel impulse response corresponding to a time delay of odd number of stages are obtained. At step 504, only real parts $\{\Re\{x_2\}, \Re\{x_4\}, \ldots\}$ of the complex autocorrelation values of the channel impulse response corresponding to a time delay of an even number of stages is obtained. At step 506, the estimated ISI term for all $2^{L+1}$ Viterbi states is pre-computed, using the real and imaginary parts obtained at steps 502 and 504. Step 506 is performed by the method described with reference to equations (4) and (5). Thereafter, the first stage of the Viterbi trellis is considered as stage n at step 508.

At step 510, it is checked whether transmitted symbol $I_n$ at considered stage n is real. If transmitted symbol $I_n$ at considered stage n is real, then the surviving paths at considered stage n are determined by using the real hypothesis at step 514. If transmitted symbol $I_n$ at considered stage n is imaginary, then the surviving paths at considered stage n are determined by using the imaginary hypothesis at step 512. Steps 512 and 514 are explained with reference to FIGS. 7 and 6, respectively. After the surviving paths are determined, it is verified whether a decision regarding at least one symbol can be taken at stage n at step 516. If it is established that a decision regarding at least one symbol can be taken at stage n, then a decision is taken regarding at least one transmitted symbol using the surviving paths at step 518. At step 520, it is checked whether considered stage n is the last stage of the Viterbi trellis. If considered stage n is not the last stage of the Viterbi trellis, then the next stage is considered at stage n at step 522, and steps 510-520 are repeated for the new considered stage n. The steps 510-520 are hereinafter referred to as advancing the Viterbi trellis in accordance with the disclosed invention. Therefore, the above method of advancing the Viterbi trellis by a plurality of stages estimates a sequence of transmitted symbols.

Figure 3:
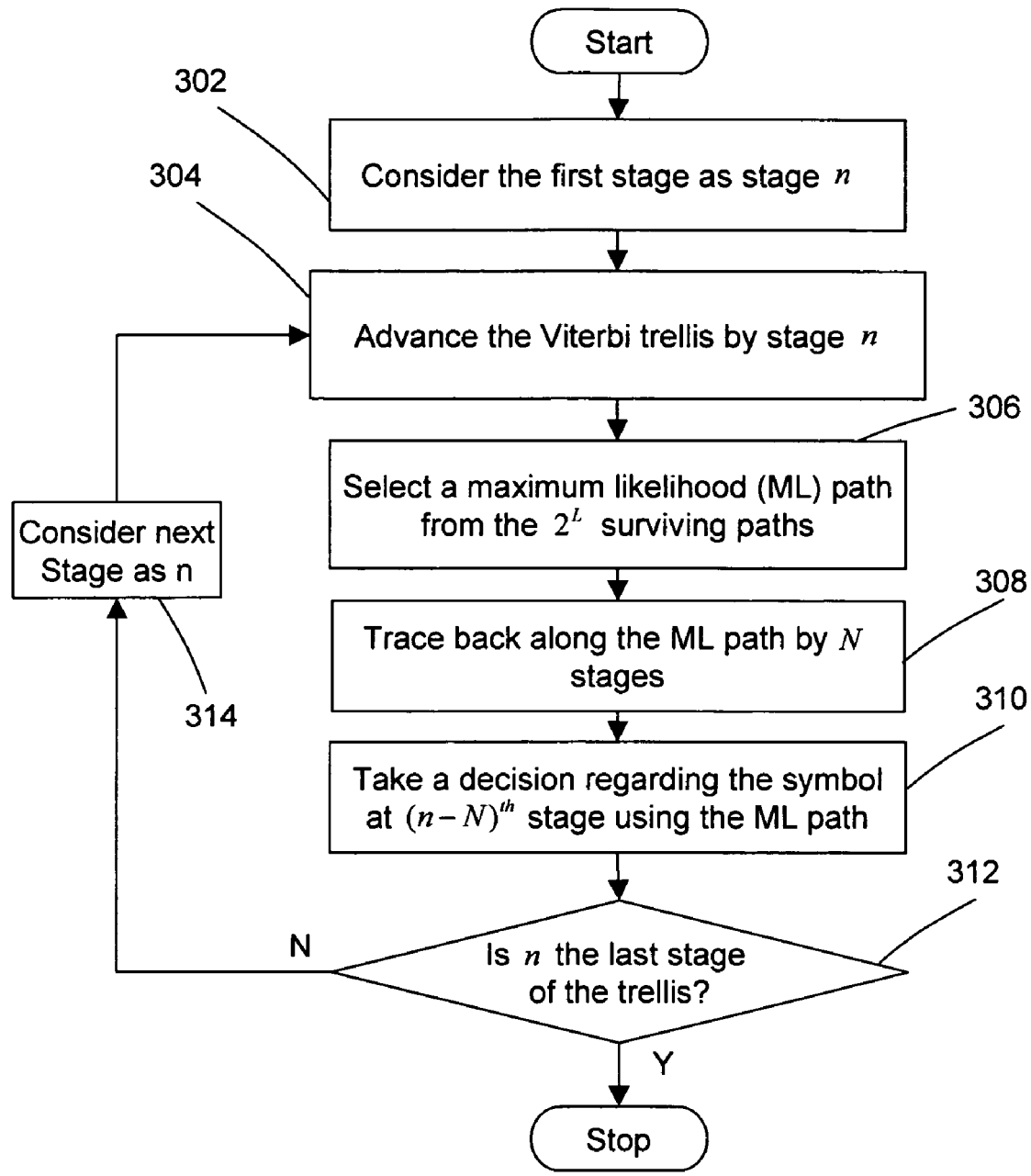
FIG. 3 is a flowchart illustrating a prior art method of estimating the maximum likelihood sequence by using the Viterbi algorithm.

In an embodiment of the disclosed invention, step 516 is performed by verifying whether the Viterbi trellis has been advanced by a predefined number of stages N. In accordance with this embodiment, step 518 is performed by performing step 306 of selecting a maximum likelihood (ML) path, step 308 of tracing back along the ML path by N stages, and step 310 of taking a decision regarding the symbol at stage n−N. Steps 306, 308, and 310 are described with reference FIG. 3.

In another embodiment of the disclosed invention, N is selected as the length of the sequence to be equalized. In accordance with this embodiment, step 518 comprises performing steps 306 and 308 described with reference to FIG. 3. Thereafter, a decision regarding symbols at all stages traced back at step 310 is taken at once.

Figure 6:
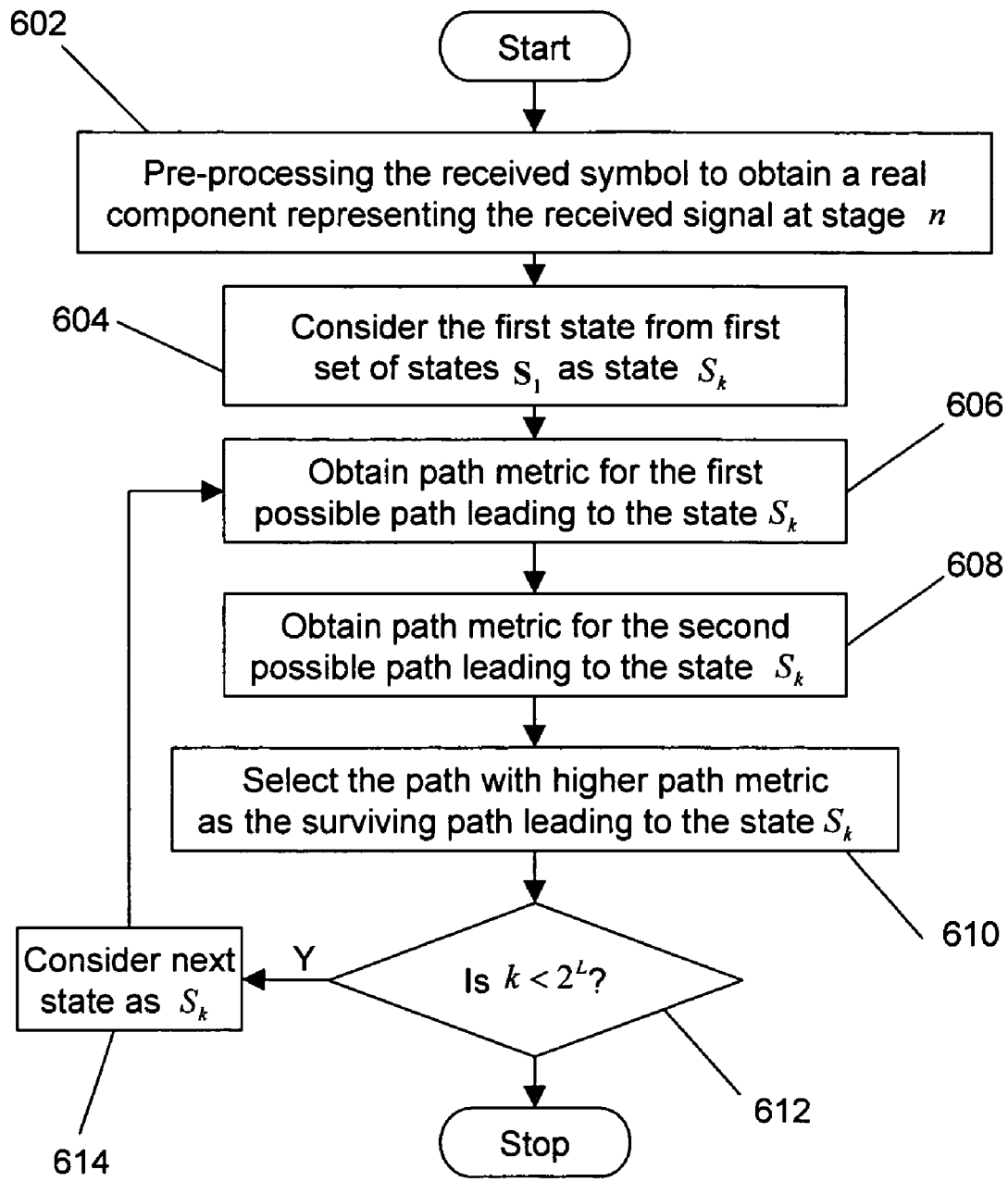
FIG. 6 is a flowchart illustrating a method of determining surviving paths using a real hypothesis, in accordance with the disclosed invention.

Referring now primarily to FIG. 6, the method of determining the surviving paths at stage n by using the real hypothesis, in accordance with the disclosed invention, is hereinafter described. At step 602, the complex received signal is preprocessed to obtain real component $\Re\{y_n\}$ representing the received symbol at stage n. The step 602 is performed, using the equation $$\Re\{y_n\} = \sum_{m=1}^{L} (\Re\{h_m\}\Re\{r_{n-m}\} - \Im\{h_m\}\Im\{r_{n-m}\}) \quad (6)$$

where $h_m$ is the $m^{th}$ channel tap, $r_{n-m}$ is the received symbol at $(n-m)^{th}$ stage. At step 604, the first state from first set of states $S_1$ is considered as state $S_k$. Thereafter, the path metric of the first possible path leading to state $S_k$ is obtained by using equation (2) at step 606. According to the real hypothesis, equation (2) is calculated, using the pre-computed estimated ISI terms for the first set of states $S_1$, real component $\Re\{y_n\}$ representing the received signal and the path metrics of the surviving paths for the state at stage n−1 on the first possible path. At step 608, the path metric of the second possible path to the leading to state $S_k$ is similarly obtained. The possible path with the higher path metric is determined as the surviving path at step 610. Thereafter, at step 612, it is checked whether Viterbi state $S_k$ is the last state of first set of states $S_1$. If the Viterbi state $S_k$ is not found to be the last state of first set of states $S_1$, then the next state from Viterbi state set S is considered as state $S_k$ at step 614. Steps 606-612 are then repeated for the new state $S_k$.

Figure 7:
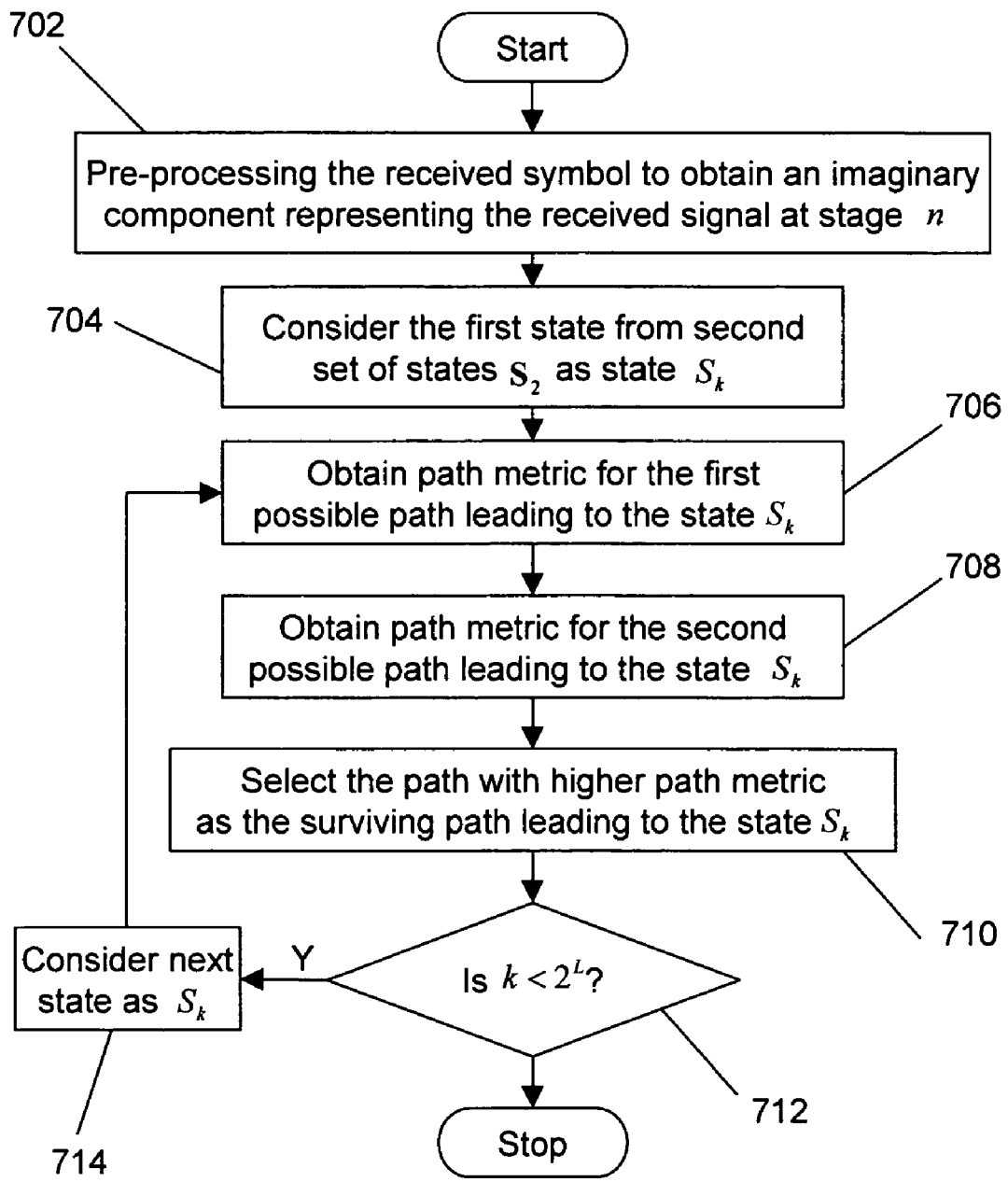
FIG. 7 is a flowchart illustrating a method of determining surviving paths using imaginary hypothesis, in accordance with the disclosed invention.

Referring now primarily to FIG. 7, the method of determining surviving paths, using imaginary hypothesis in accordance with the disclosed invention, is hereinafter described. At step 702, the complex received signal is pre-processed to obtain imaginary component $\Im\{y_n\}$ representing the received signal. The step 702 is performed using the equation $$\Im\{y_n\} = \sum_{m=1}^{L} (\Im\{h_m\}\Re\{r_{n-m}\} - \Re\{h_m\}\Im\{r_{n-m}\}) \quad (7)$$

At step 704, the first state from second set of states $S_2$ is considered as state $S_k$. Thereafter, the path metric of the first possible path leading to state $S_k$ is obtained using equation (3) at step 706. According to imaginary hypothesis, equation (3) is calculated by using the pre-computed estimated ISI terms for the second set of states $S_2$, imaginary component $\Im\{y_n\}$ representing the received signal and the path metrics of the surviving paths for the state at the previous stage on the first possible path. At step 708, the path metric of the second possible path leading to state $S_k$ is similarly obtained. The possible path with higher path metric is determined as the surviving path at step 710. Thereafter, at step 712, it is checked whether Viterbi state $S_k$ is the last state of second set of states $S_2$. If the Viterbi state $S_k$ is not found to be the last state of second set of states $S_2$ then the next state from second set of state $S_2$ is considered as state $S_k$ at step 714. Steps 706-712 are then repeated for the new state $S_k$.

As described with reference to FIG. 4, equations (2) and (3) are used to obtain the path metric of a path. The path metric of the two possible paths leading to the same state at a stage are compared to determine the surviving path. It can be observed that for MSK symbols the last term of equation (2) is independent of the possible path, since the absolute value of $I_n$ is 1 for all values of the MSK symbols. Similarly, the last term of equation (3) is also independent of the possible path. Therefore, equations (2) and (3) can be modified as:

$$CM_n(I_n, S_k) = \quad (8)$$
$$CM_{n-1}(I_{n-1}, S_{k'}) + 2\Re\{I_n\} * \Re\{y_n\} - 2\Re\left\{I_n * \sum_{m=1}^{L} I_{n-m} * x_m\right\}$$

$$CM_n(I_n, S_k) = \quad (9)$$
$$CM_{n-1}(I_{n-1}, S_{k'}) - 2\Im\{I_n\} * \Im\{y_n\} - 2\Re\left\{I_n * \sum_{m=1}^{L} I_{n-m} * x_m\right\}$$

In a further embodiment of the disclosed invention, equations (8) and (9) are used in place of equation (2) and (3) for obtaining the path metric of a path.

Figure 8:
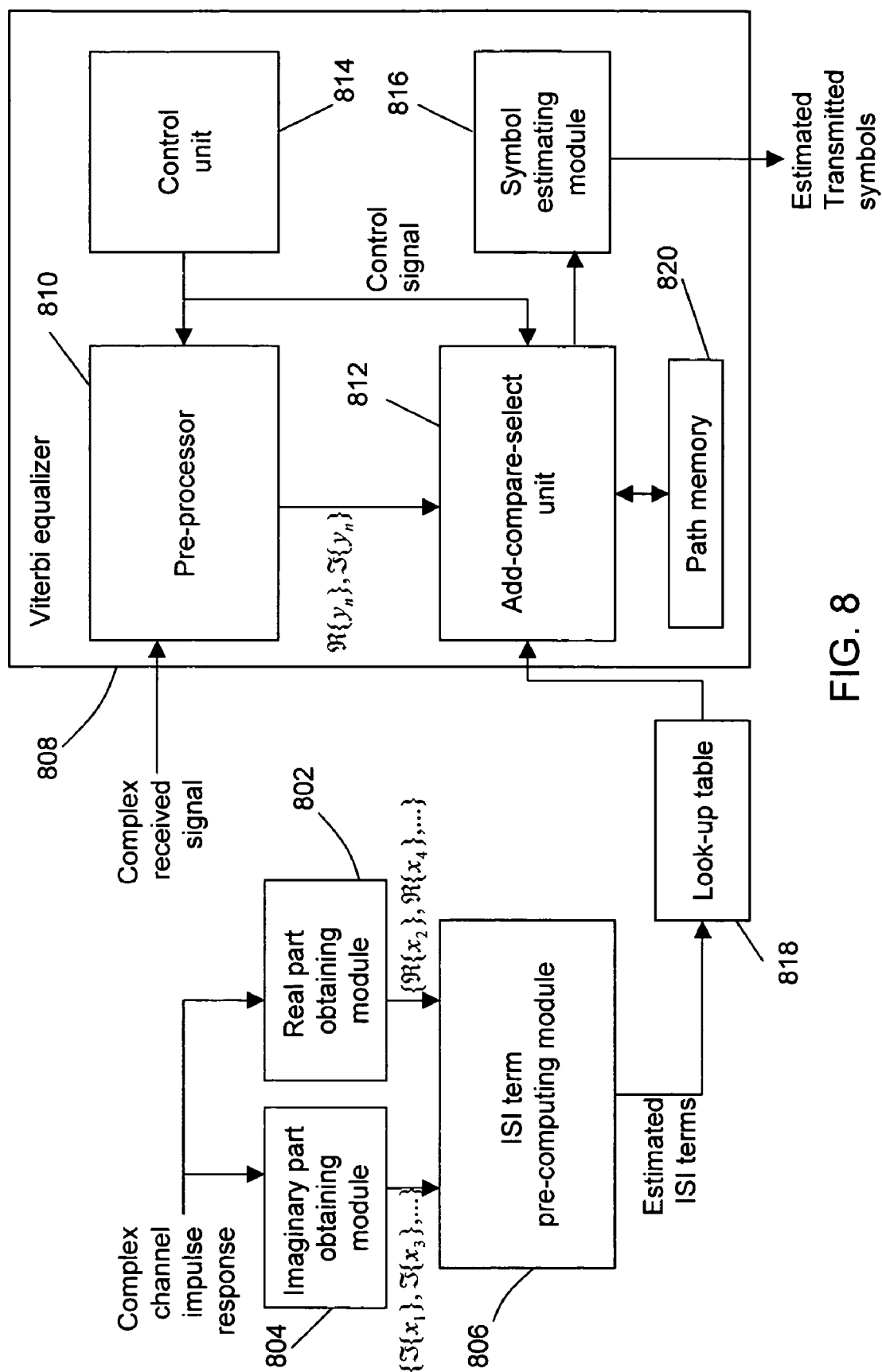
FIG. 8 is a block diagram illustrating a system for estimating a transmitted signal at a wireless receiver, in accordance with the disclosed invention.

Referring now primarily to FIG. 8, a system for estimating a transmitted signal at a wireless receiver, in accordance with the disclosed invention, is hereinafter described. The system, in accordance with the disclosed invention, comprises a real part obtaining module 802, an imaginary part obtaining module 804, an ISI term pre-computing module 806, and a Viterbi equalizer 808. Real part obtaining module 802 obtains only the real parts of the complex autocorrelation values of the channel impulse response corresponding to a time delay of an even number of stages. Imaginary part obtaining module 804 obtains only the imaginary parts of the complex autocorrelation values of the channel impulse response corresponding to a time delay of an odd number of stages. ISI term pre-computing module 806 pre-computes estimated ISI terms for all Viterbi states using the real and imaginary parts of the complex autocorrelation values obtained by real part obtaining module 802 and imaginary part obtaining module 804. Viterbi equalizer 808 advances the Viterbi trellis by a stage using the pre-computed estimated ISI terms and the received signal.

Figure 9:
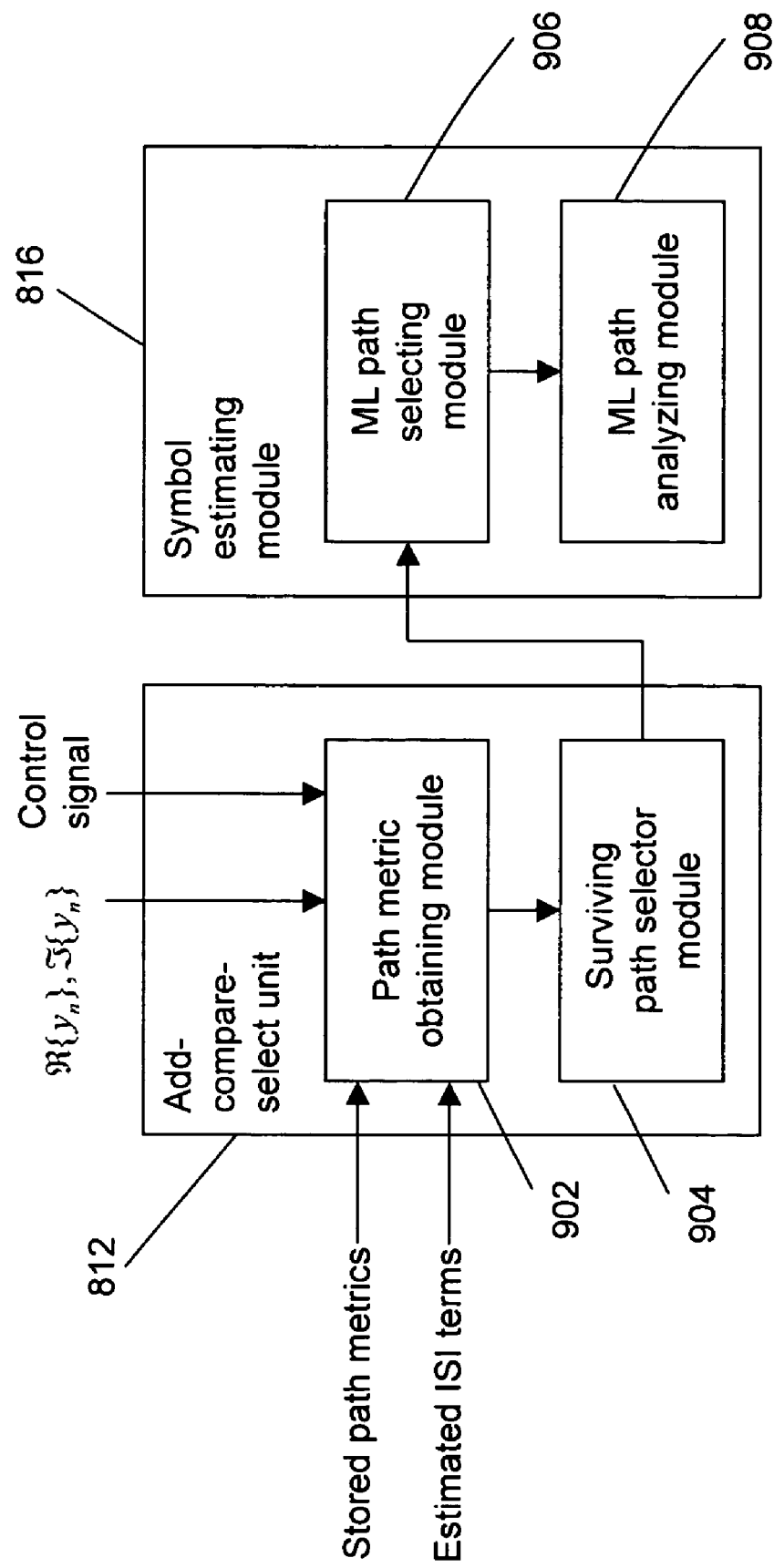
FIG. 9 is a block diagram illustrating an add-compare-select unit and a symbol estimating module operating in accordance with an embodiment of the disclosed invention.

Viterbi equalizer 808 comprises a pre-processor 810, an add-compare-select unit 812 (described further in FIG. 9), a control unit 814, and a symbol estimating module 816 (described further in FIG. 9). Control unit 814 determines whether the transmitted symbol at a stage is real or imaginary, and depending on the result, generates a control signal to pre-processor 810 and add-compare-select unit 812. The pre-processor 810 pre-processes the complex received signal, depending on the control signal. For the control signal corresponding to the real transmitted symbol, pre-processor 810, obtains real component $\Re\{y_n\}$ representing the received symbol. For the control signal corresponding to the imaginary transmitted symbol, pre-processor 810 obtains imaginary component $\Im\{y_n\}$ representing the received symbol. If the control signal corresponds to the real transmitted symbol, add-compare-select unit 812 determines the surviving path for first set of states $S_1$ in accordance with the real hypothesis. If the control signal corresponds to the imaginary transmitted symbol, add-compare-select unit 812 determines the surviving path for second set of states $S_2$ in accordance with the imaginary hypothesis. Symbol estimating module 816 estimates at least one transmitted symbols, using the surviving paths determined by add-compare-select unit 812.

In an embodiment of the disclosed invention, the system described with reference to FIG. 8 comprises a look-up table 818 storing the estimated ISI terms pre-computed by ISI term pre-computing module 806. Add-compare-select unit 812 fetches the pre-computed estimated ISI terms from look-up table 818.

In an embodiment of the disclosed invention, Viterbi equalizer 808 comprises a path memory 820, which stores the path metrics of the surviving paths at a stage. Add-compare-select unit stores the path metrics of the surviving paths at a stage in path memory 820, to be used for computing path metrics for the subsequent stage.

Referring now primarily to FIG. 9, add-compare-select unit 812 and symbol estimating module 816, operating in accordance with an embodiment of the disclosed invention, is hereinafter described. Add-compare-select unit 812 comprises a path metric obtaining module 902 and a surviving path selector module 904. Path metric obtaining module 902 obtains the path metric for a possible path leading to a Viterbi state at a stage using the control signal, real components $\Re\{y_n\}$, imaginary components $\Im\{y_n\}$, and estimated ISI terms obtained by ISI term pre-computing module 806. Surviving path selector module 904 uses the path metric obtained by path metric obtaining module 902 to determine the surviving path leading to a stage. The symbol estimating module comprises an ML path selecting module 906, and an ML path analyzing module 908. ML path selecting module 906 selects an ML path at a stage from the surviving paths obtained by the add-compare select unit. In an embodiment of the disclosed invention, the ML path is obtained by selecting the surviving path with maximum path metric. ML path analyzing module 908 analyzes the ML path obtained by ML path selecting module 906, to estimate at least one MSK symbol. In an embodiment of the disclosed invention, ML path analyzing module 908 comprises means for tracing back along the ML path to an earlier stage, to estimate the transmitted symbol at that earlier stage. In another embodiment of the disclosed invention, ML path analyzing module 908 comprises means for tracing back along the ML path by a finite number of earlier stages, to estimate the symbols corresponding to all the stages being traced back.

Figure 10:
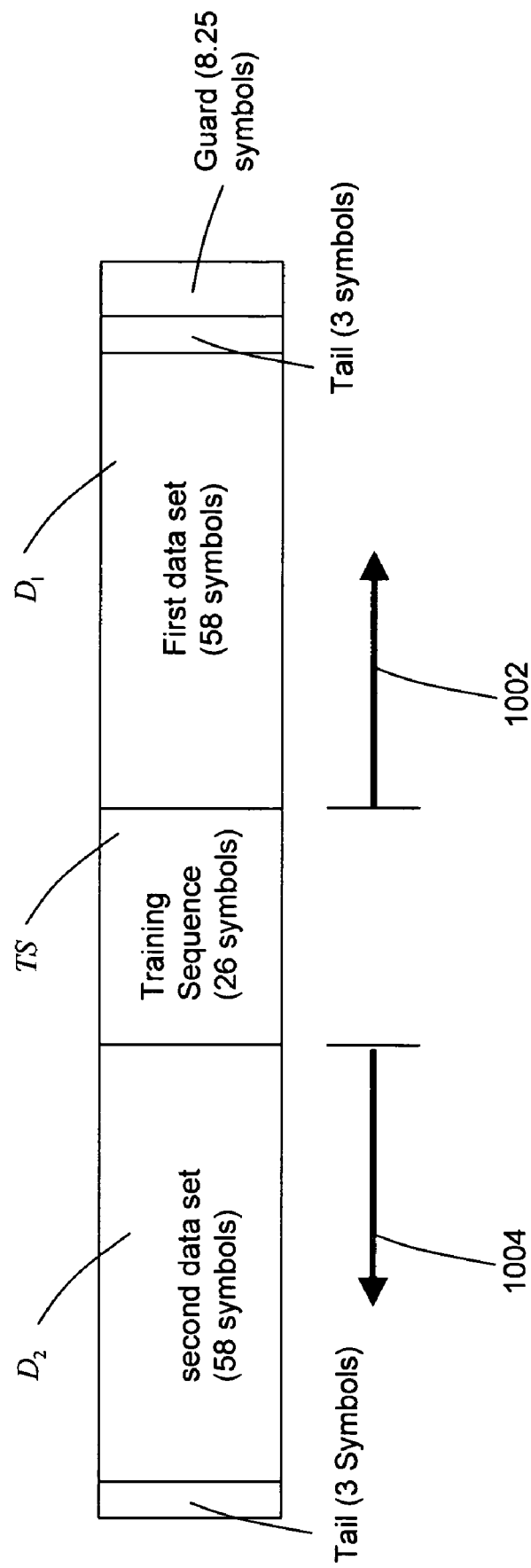
FIG. 10 is a block diagram illustrating a GSM data burst.

In digital communication systems such as GSM, the symbols are transmitted in the form of data bursts. A data burst is a set of symbols comprising control symbols in addition to data symbols. Certain data bursts comprise a set of control symbols known as a training sequence. The training sequence is generally present in a data burst in the midamble and its symbols are already known by the wireless receiver. FIG. 10 schematically illustrates a GSM data burst. The GSM data burst comprises a 26-symbol training sequence in the midamble. A first data set $D_1$ residing in the data burst, comprising 58 data symbols, follows the training sequence. Further, a second data set $D_2$ residing in the data burst, also comprising 58 data symbols, precedes the training sequence. The header and footer of the GSM data burst comprise a tail of three symbols. Also, the last 8.25 symbols of the GSM data burst constitute guard symbols. The above example is provided to illustrate the invention, and in no way limits the scope of the invention, which can be implemented with various other communication systems.

It can be observed that for estimating the symbols of a data burst, such as the GSM data burst, an equalizer does not need to estimate the symbols of the training sequence, since they are already known to the wireless receiver. Therefore, the disclosed invention equalizes only the symbols of first data set $D_1$ and second data set $D_2$. For equalizing the symbols of first data set $D_1$, the Viterbi trellis is advanced by considering the symbols in the order of their transmission, illustrated by the direction 1002. The method of advancing the Viterbi trellis by considering the symbols in their order of transmission is hereinafter referred to as advancing the Viterbi trellis in a forward time direction. The Viterbi trellis is advanced in a forward time direction in accordance with the method described with reference to FIGS. 5, 6 and 7. Further, for equalizing the symbols of second data set $D_2$, the Viterbi trellis is advanced by considering the symbols in the reverse order of their transmission, illustrated by the direction 1004. The method of advancing the Viterbi trellis by considering the symbols in the reverse order of their transmission is hereinafter referred to as advancing the Viterbi trellis in a backward time direction. The Viterbi trellis is advanced in a backward time direction in accordance with the method described with reference to FIGS. 5, 6 and 7. However, for advancement in the backward time direction, the autocorrelation of the channel impulse response needs to be modified according to the time direction. Therefore, conjugate $x_m^*$ of the autocorrelation $x_m$ of the channel impulse response corresponding to the time delay of m stages is used for advancing the Viterbi trellis in a backward time direction. Therefore, the estimated ISI term is obtained as $$2\Re\left\{I_n * \sum_{m=1}^{L} I_{n-m} * x_m^*\right\},$$

where the symbols $\{I_{n-1}, I_{n-2}, \ldots, I_{n-L}\}$ are in the reverse order of their transmission. For example, for an ISI of 4 symbols, the estimated ISI terms for the first set of states $S_1$ according to the real hypothesis is calculated as $$2\Re\left\{I_n * \sum_{m=1}^{L} I_{n-m} * x_m^*\right\} = \quad (10)$$

$$b_n(b_{n-1}\Im\{x_1\} + b_{n-2}\Re\{x_2\} + b_{n-3}\Im\{x_3\} + b_{n-4}\Re\{x_4\}),$$

where $b_n = |I_n|$, $\Re\{x_m\}$ represents the real part of $x_m$, and $\Im\{x_m\}$ represents the imaginary part of $x_m$. Also, the estimated ISI terms for the second set of states $S_2$, according to the imaginary hypothesis, is calculated as $$2\Re\left\{I_n * \sum_{m=1}^{L} I_{n-m} * x_m^*\right\} = \quad (11)$$

$$b_n(-b_{n-1}\Im\{x_1\} + b_{n-2}\Re\{x_2\} - b_{n-3}\Im\{x_3\} + b_{n-4}\Re\{x_4\})$$

It can be noted that the right-hand side of equation (10) is the same as that of equation (5). Also, the right-hand side of equation (11) is the same as that of equation (4). Therefore, the estimated ISI terms, in accordance with the real hypothesis, pre-computed for the forward time direction, can be reused as the estimated ISI terms, in accordance with the imaginary hypothesis for the backward time direction. Similarly, the estimated ISI terms, in accordance with the imaginary hypothesis, pre-computed for the forward time direction, can be reused as the estimated ISI terms, in accordance with the real hypothesis for the backward time direction.

Figure 11:
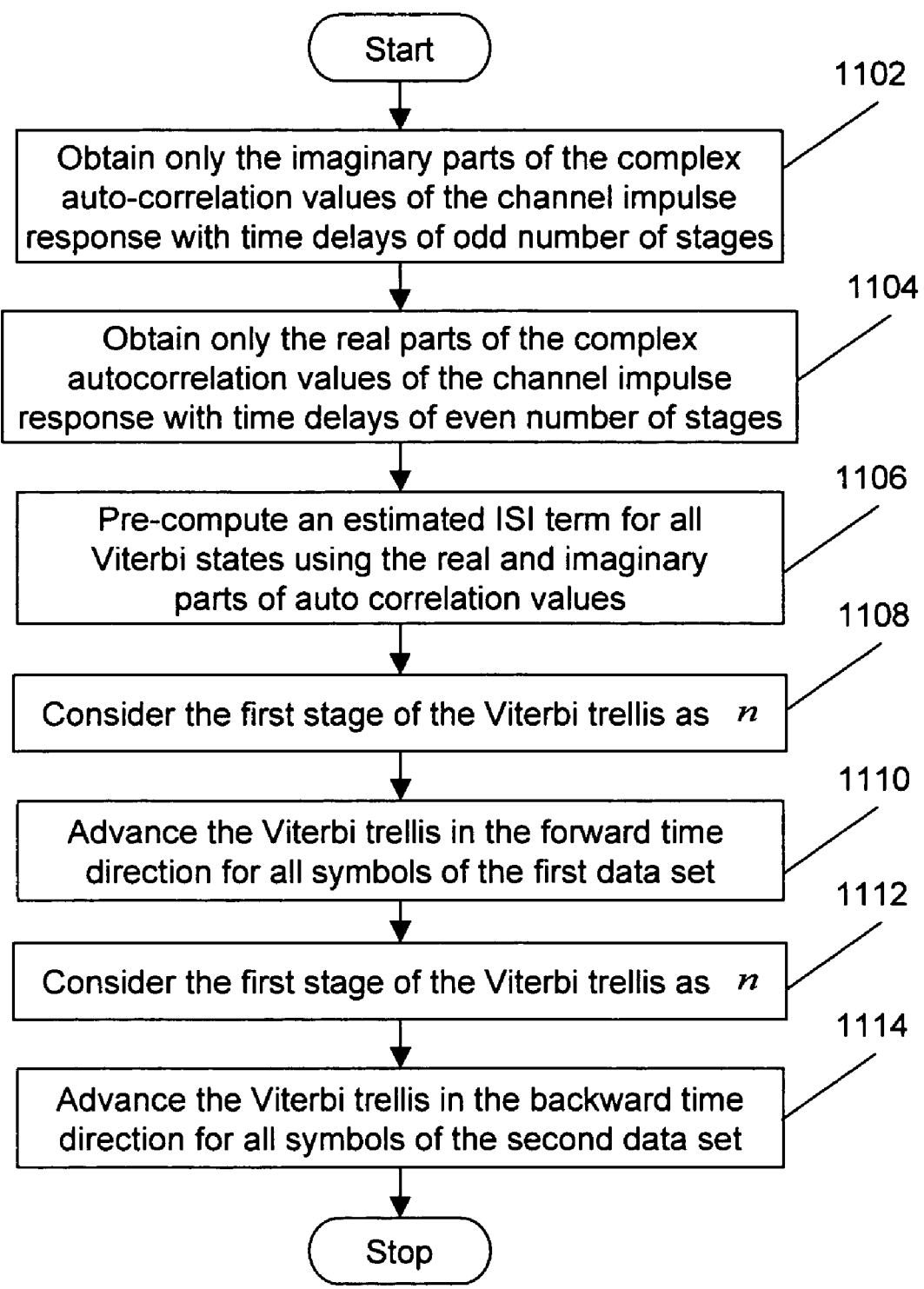
FIG. 11 is a flowchart illustrating a method of estimating the transmitted MSK symbols of a data burst, in accordance with an embodiment of the disclosed invention.

Referring now primarily to FIG. 11, a method of estimating the transmitted MSK symbols of a data burst, in accordance with an embodiment of the disclosed invention, is hereinafter described. At step 1102, only imaginary parts $\{\Im\{x_1\}, \Im\{x_3\}, \ldots\}$ of the complex autocorrelation values of the channel impulse response, corresponding to a time delay of an odd number of stages, are obtained for forward time direction. At step 1104, only real parts $\{\Re\{x_2\}, \Re\{x_4\}, \ldots\}$ of the complex autocorrelation values of the channel impulse response, corresponding to a time delay of an even number of stages, are obtained for forward time direction. At step 1106, the estimated ISI terms for all $2^{L+1}$ Viterbi states are pre-computed, using the real and imaginary parts obtained at steps 1102 and 1104. At step 1108, the first stage of the Viterbi trellis is considered as the considered stage n. The Viterbi trellis is advanced in the forward time direction to estimate all the symbols of first data set $D_1$ at step 1110, using the estimated ISI terms pre-computed at step 1106. At step 1112, the first stage of the Viterbi trellis is again considered as the considered stage n. Thereafter, the Viterbi trellis is advanced in the backward time direction to estimate all symbols of second data set $D_2$ at step 1114. Step 1114 is performed by reusing the estimated ISI terms pre-computed at step 1106. The reusing of the pre-computed estimated ISI term is described with reference to equations (10) and (11).

Figure 12:
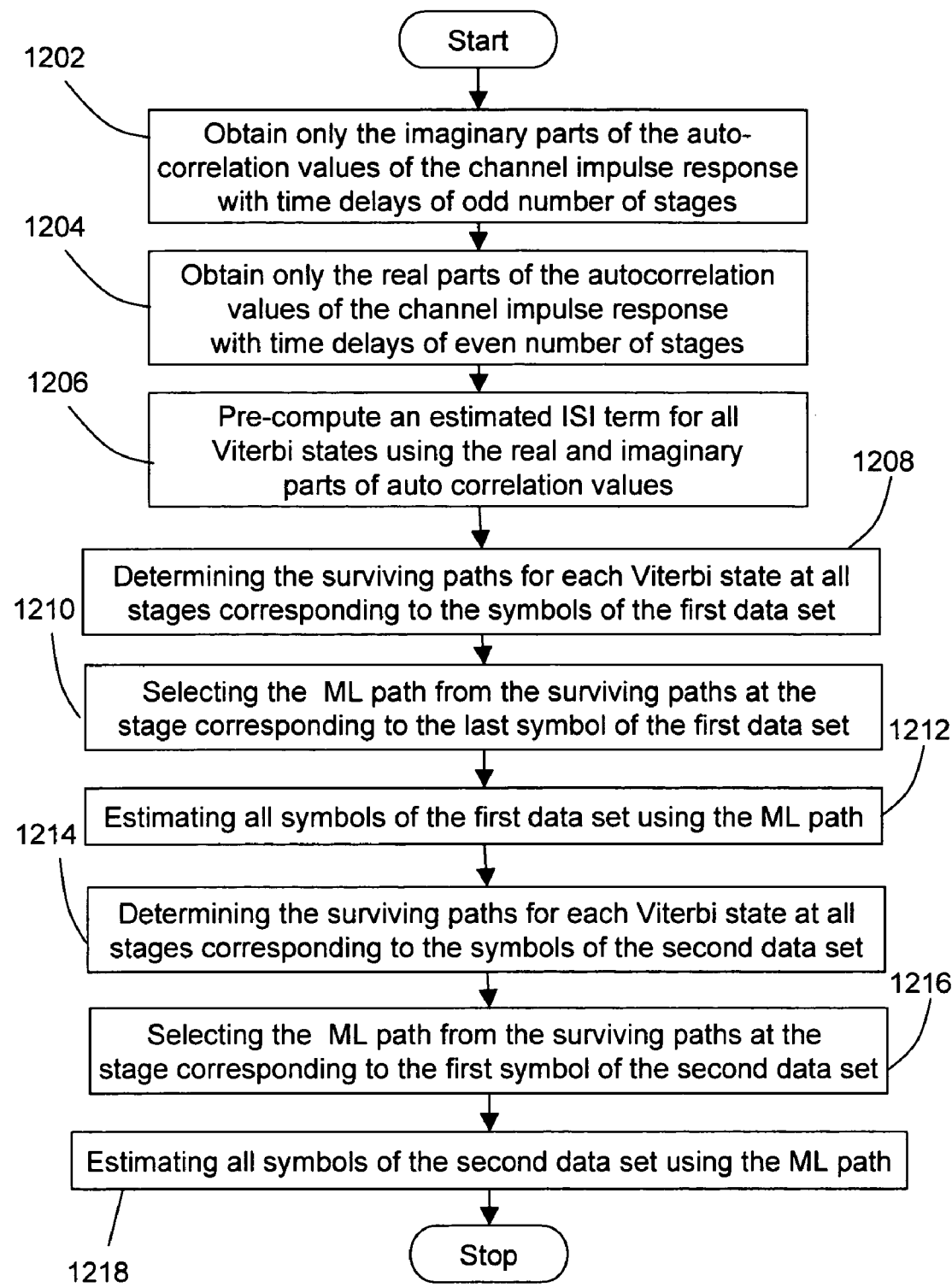
FIG. 12 is a flowchart illustrating a method of estimating the transmitted MSK symbols of a data burst, in accordance with another embodiment of the disclosed invention.

Referring now primarily to FIG. 12, a method of estimating the transmitted MSK symbols of a data burst, in accordance with an embodiment of the disclosed invention, is hereinafter described. At step 1202, only imaginary parts $\{\Im\{x_1\}, \Im\{x_3\}, \ldots\}$ of the complex autocorrelation values of the channel impulse response corresponding to a time delay of an odd number of stages are obtained for a forward time direction. At step 1204, only real parts $\{\Re\{x_2\}, \Re\{x_4\}, \ldots\}$ of the complex autocorrelation values of the channel impulse response corresponding to a time delay of an even number of stages are obtained for a forward time direction. At step 1206, the estimated ISI terms for all $2^{L+1}$ Viterbi states are pre-computed, using the real and imaginary parts obtained at steps 1202 and 1204. Thereafter, the surviving path for each Viterbi state at all stages corresponding to the symbols of first data set $D_1$ is determined at step 1208. Step 1208 is performed in accordance with the method described with reference to FIG. 6 and FIG. 7 using the estimated ISI terms obtained at 1206. However, the ML path is not selected at each stage. Once the surviving paths are obtained for the stage corresponding to the last symbol of first data set $D_1$, the path with the highest path metric is selected as a first ML path at step 1210. All symbols of first data set $D_1$ are estimated at once, using the first ML path at step 1212. Similarly, the surviving path for each Viterbi state at all stages corresponding to the symbols of second data set $D_2$ is determined at step 1214. Step 1214 is performed in accordance with the method described with reference to FIG. 6 and FIG. 7, reusing the estimated ISI terms obtained at 1206 as described with reference to equations (10) and (11). However, the ML path is not selected at each stage. Once the surviving paths are obtained for the stage corresponding to the first symbol of second data set $D_2$, the path with highest path metric is selected as a second ML path at step 1216. All symbols of second data set $D_2$ are estimated at once using the second ML path at step 1218. The above method is computationally efficient as the selection of the ML path is avoided at each stage. Further, the estimation of the transmitted symbols is accurate when the estimation is carried out by using the ML path for a complete data set.

Figure 13:
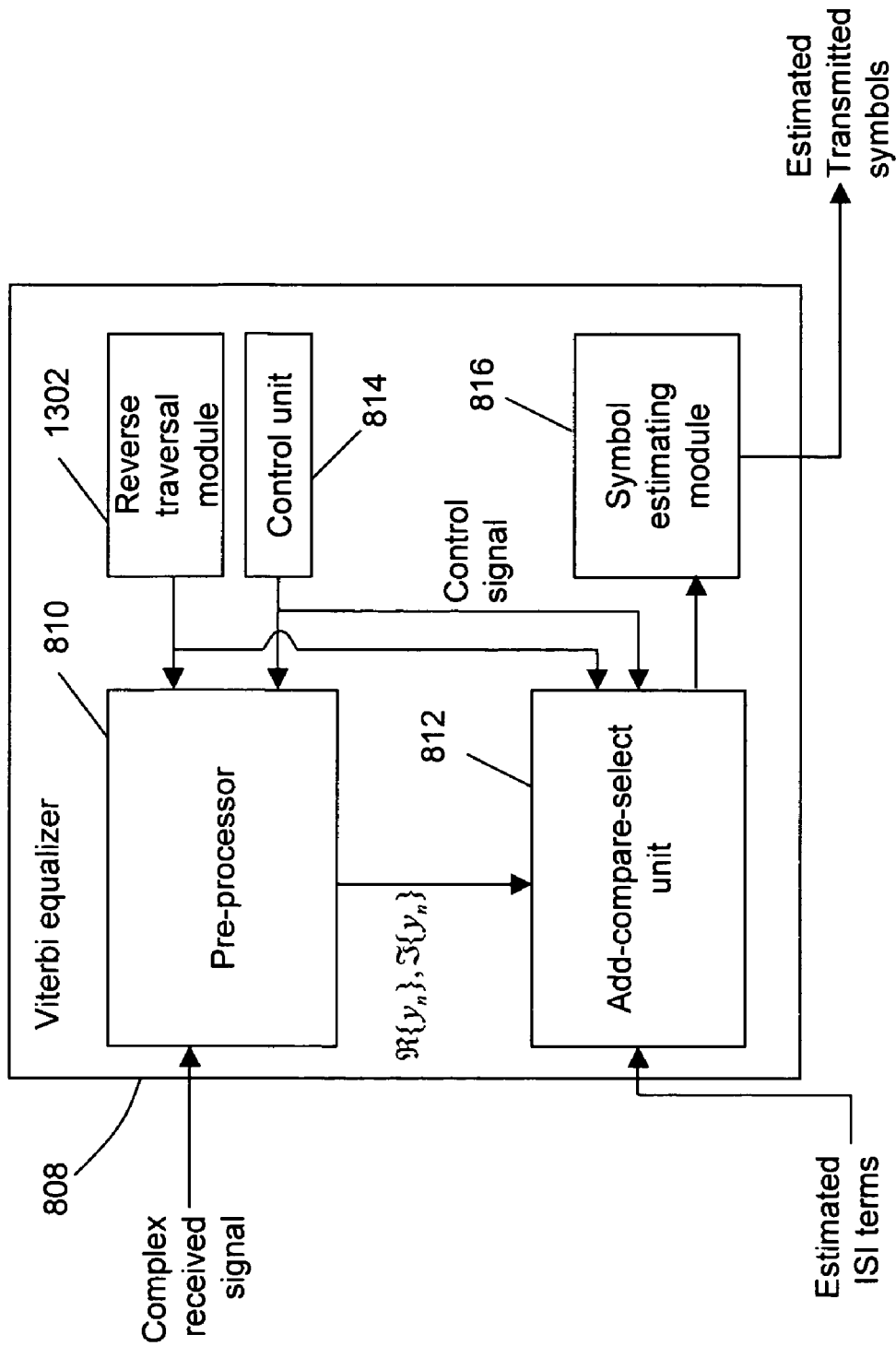
FIG. 13 is a block diagram illustrating a Viterbi equalizer, advancing the Viterbi trellis in both backward and forward time directions, in accordance with an embodiment of the disclosed invention.

Referring now primarily to FIG. 13, Viterbi equalizer 808, the means for advancing the Viterbi trellis in both backward and forward time directions, in accordance with an embodiment of the disclosed invention, is hereinafter described. In accordance with this embodiment, Viterbi equalizer 808 comprises a reverse traversal module 1302, in addition to pre-processor 810, add-compare-select unit 812, control unit 814, and symbol estimating module 816. Reverse traversal module 1302 controls pre-processor 810 and add-compare-select unit 812, depending on the desired direction of advancing the Viterbi trellis. For advancing the Viterbi trellis in the forward time direction reverse traversal module 1302 controls pre-processor 810 and add-compare-select unit 812, to operate as described with reference to FIG. 8 and FIG. 9. However, for advancing the Viterbi trellis in a backward time direction, reverse traversal module 1302 controls pre-processor 810 to process the symbols of the complex received signal in the reverse order of their transmission. Further, for advancing the Viterbi trellis in a backward time direction, reverse traversal module 1302 controls add-compare-select unit 812, to determine the surviving path for first set of states $S_1$ using the estimated ISI terms obtained, according to the imaginary hypothesis; and to determine the surviving path for second set of states $S_2$ using the estimated ISI terms obtained according to the real hypothesis. Therefore, reverse traversal module 1302 enables Viterbi equalizer 808 to advance the Viterbi trellis both in the forward and backward time directions. Therefore, Viterbi equalizer 808 is used to estimate the transmitted MSK symbols of a data burst, described with reference to FIGS. 11 and 12.

The disclosed invention may be implemented by using a dedicated Application Specific Integrated Circuit (ASIC). Alternately, it may be implemented by using a Digital Signal Processor (DSP) chip or a Field Programmable Gate Array (FPGA). It will be apparent to one skilled in the art that the disclosed invention may also be embodied in a computer program product using either a processor specific assembly language or a high-level language such as C. The computer program product embodiment of the disclosed invention can be used for either the implementation of an equalizer or of a simulation model of the equalizer.

The disclosed method, system and computer program product achieves the efficient equalization of the transmitted MSK symbols at the wireless receiver. Since the MSK properties of the transmitted symbols are exploited by the disclosed invention, differential decoding is not required for equalization. Also, the effective number of Viterbi states is reduced by a factor of two, since the real and imaginary hypothesis is used for the first and second set of states, respectively. Therefore, the memory required for storing the path metric information is reduced. The pre-computation of the estimated ISI terms further increases the efficiency of the equalization process, without affecting the accuracy. Additionally, the forward and backward advancement of the Viterbi trellis for the first and second data sets, respectively, results in better efficiency since the equalization of the training sequence is avoided, and the pre-computation of the estimated ISI term is reused for advancing the Viterbi trellis in the backward time direction. Therefore, the disclosed invention provides an efficient equalization process for MSK symbols.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method of estimating at least one transmitted MSK symbol by a Viterbi equalizer at a wireless receiver, the transmitted MSK symbols being alternately real and imaginary, the Viterbi states possible at the stages corresponding to real symbols constituting a first set of states, the Viterbi states possible at the stages corresponding to imaginary symbols constituting a second set of states, the method comprising the steps of:

a. obtaining only the imaginary parts of the autocorrelation values of the channel impulse response corresponding to a time delay of odd number of stages;

b. obtaining only the real parts of the autocorrelation values of the channel impulse response corresponding to a time delay of even number of stages;

c. pre-computing an estimated ISI term for all Viterbi states using the real and imaginary parts obtained at steps (a) and (b);

d. advancing the Viterbi trellis by a stage comprising the steps of:

i. if the transmitted MSK symbol corresponding to the stage is real then performing steps of:

1. pre-processing the received symbol at the stage to obtain a real component representing the received symbol corresponding to the stage; and 2. determining the surviving path for only the first set of states at the stage, using the estimated ISI terms corresponding to the first set of states, the real component representing the received symbol corresponding to the stage and the path metrics of the surviving paths at the previous stage;

else performing the steps of:

1. pre-processing the received symbol at the stage to obtain an imaginary component representing the received symbol corresponding to the stage; and 2. determining the surviving path for only the second set of states at the stage, using the estimated ISI terms corresponding to the second set of states, the imaginary component representing the received symbol corresponding to the stage and the path metrics of the surviving paths at the previous stage;

ii. determining whether at least one transmitted MSK symbol can be estimated at the stage; and iii. estimating at least one transmitted MSK symbol using the surviving paths at the stage if it is determined that at least one transmitted MSK symbol can be estimated at the stage.

2. The method as recited in claim 1 wherein the step of estimating at least one transmitted MSK symbol using the surviving paths at the stage comprises the steps of:

a. selecting a maximum likelihood path from the surviving paths at the stage; and b. analyzing the maximum likelihood path to estimate at least one transmitted MSK symbol.

3. The method as recited in claim 1 wherein the step of determining whether at least one transmitted MSK symbol can be estimated at the stage comprises determining whether the Viterbi trellis has been advanced for a predefined number of stages N.

4. The method as recited in claim 2 wherein the step of analyzing the maximum likelihood path to estimate at least one transmitted MSK symbol comprises tracing back along the maximum likelihood path to the $N^{th}$ previous stage to estimate the transmitted MSK symbol at the $N_{th}$ previous stage.

5. The method as recited in claim 2 wherein the step of analyzing the maximum likelihood path to estimate at least one transmitted MSK symbol comprises tracing back along the maximum likelihood path by previous N stages to estimate the transmitted MSK symbols at the previous N stages.

6. The method as recited in claim 1 wherein the step of determining the surviving path for only the first set of states at the stage comprises, for each state of the first set of states, comprises the steps of:

a. obtaining the path metric of the first possible path leading to the state at the stage, using the estimated ISI terms corresponding to the state, the real component representing the received symbol corresponding to the stage and the path metric of the surviving path for the state at the previous stage on the first possible path;

b. repeating step (a) for the second possible path leading to the state at the stage; and c. selecting the path having greater path metric as the survivor path to the state at the stage.

7. The method as recited in claim 2 wherein the step of selecting the maximum likelihood path from the surviving paths comprises selecting the surviving path with maximum path metric.

8. The method as recited in claim 6 wherein the step of obtaining the path metric $CM_n(I_n)$ of a possible path leading to the state at the stage n comprises calculating $CM_n(I_n)$ using the relation $$CM_n(I_n) = CM_{n-1}(I_{n-1}) + 2\Re\{I_n\}\Re\{y_n\} - 2\Re\left\{I_n * \sum_{m=1}^{L} I_{n-m} * x_m\right\} - |I_n|^2 x_0,$$

where $CM_{n-1}(I_{n-1})$ is the path metric of the possible path at stage n−1, $I_n$ denotes the transmitted MSK symbol corresponding to stage n, $\Re\{I_n\}$ denotes real part of the transmitted MSK symbol corresponding to stage n, $\Re\{y_n\}$ is the real component representing the received symbol corresponding to the stage n, $x_m$ is the autocorrelation value of the channel impulse response for the time delay of m stages.

9. The method as recited in claim 6 wherein the step of obtaining the path metric $CM_n(I_n)$ of a possible path leading to the state at the stage n comprises calculating $CM_n(I_n)$ using the relation $$CM_n(I_n) = CM_{n-1}(I_{n-1}) + 2\Re\{I_n\}\Re\{y_n\} - 2\Re\left\{I_n * \sum_{m=1}^{L} I_{n-m} * x_m\right\},$$

where $CM_{n-1}(I_{n-1})$ is the path metric of the possible path at stage n−1, $I_n$ denotes the transmitted MSK symbol corresponding to stage n, $\Re\{I_n\}$ denotes real part of the transmitted MSK symbol corresponding to stage n, $\Re\{y_n\}$ is the real component representing the received symbol corresponding to the stage n, $x_M$ is the autocorrelation value of the channel impulse response for the time delay of m stages.

10. The method as recited in claim 2 wherein the step of determining the surviving path for only the second set of states at the stage, for each state of the second set of states, comprises the steps of:

a. obtaining the path metric of the first possible path leading to the state at the stage, using the estimated ISI terms corresponding to the state, the imaginary component representing the received symbol corresponding to the stage and the path metric of the surviving path for the state at the previous stage on the first possible path;

b. repeating step (a) for the second possible path leading to the state at the stage; and c. selecting the path having greater path metric as the survivor path to the state at the stage.

11. The method as recited in claim 2 wherein the step of selecting the maximum likelihood path from the surviving paths comprises selecting the surviving path with maximum path metric.

12. The method as recited in claim 1 wherein the step of advancing the Viterbi trellis by a stage comprises considering the stages in the reverse time direction.

13. The method as recited in claim 1 wherein the step of pre-computing an estimated ISI term l for $k^{th}$ Viterbi state comprises calculating l using the relation $$l = 2\Re\left\{I_n * \sum_{m=1}^{L} I_{n-m} * x_m\right\},$$

where $I_n$ is the transmitted MSK symbol corresponding to stage n, $x_m$ is the autocorrelation value of the channel impulse response for the time delay of m stages, and the transmitted MSK symbols $\{I_{n-1}, I_{n-2} \ldots, I_{n-L}\}$ correspond to $k^{th}$ Viterbi state.

14. The method as recited in claim 1 wherein the step of pre-processing the received symbol at the stage to obtain a real component $\Re\{y_n\}$ representing the received symbol corresponding to the stage n comprises calculating $\Re\{y_n\}$ using the relation $$\Re\{y_n\} = \sum_{m=1}^{L} \{\Re\{h_m\}\Re\{r_{n-m}\} - \Im\{h_m\}\Im\{r_{n-m}\}\},$$

where $\Re\{h_m\}$ is the real part of the $m^{th}$ channel tap, $\Im\{h_m\}$ is the imaginary part of the $m^{th}$ channel tap, $\Re\{r_{n-m}\}$ is the real part of the received symbol at the $(n-m)^{th}$ stage, $\Im\{r_{n-m}\}$ is the imaginary part received symbol at the $(n-m)^{th}$ stage.

15. The method as recited in claim 1 wherein the step of pre-processing the received symbol at the stage to obtain an imaginary component $\Im\{y_n\}$ representing the received symbol corresponding to the stage n is performed using the relation $$\Im\{y_n\} = \sum_{m=1}^{L} (\Im\{h_m\}\Re\{r_{n-m}\} + \Re\{h_m\}\Im\{r_{n-m}\}),$$

where $\Re\{h_m\}$ is the real part of the $m^{th}$ channel tap, $\Im\{h_m\}$ is the imaginary part of the $m^{th}$ channel tap, $\Re\{r_{n-m}\}$ is the real part of the received symbol at the $(n-m)^{th}$ stage, $\Im\{(r_{n-m}\}$ is the imaginary part received symbol at the $(n-m)^{th}$ stage.

16. A method of estimating at least one transmitted MSK symbol by a Viterbi equalizer at a wireless receiver, the transmitted MSK symbols being alternately real and imaginary, the Viterbi states possible at the stages corresponding to real symbols constituting a first set of states, the Viterbi states possible at the stages corresponding to imaginary symbols constituting a second set of states, a predefined number of transmitted MSK symbols constituting a data burst, the data burst comprising a training sequence as a midamble, the set of symbols transmitted after the midamble constituting a first data set, the set of symbols transmitted before the midamble constituting a second data set, the method comprising the steps of:

a. obtaining only the imaginary parts of the autocorrelation values of the channel impulse response corresponding to a time delay of odd number of stages;

b. obtaining only the real parts of the autocorrelation values of the channel impulse response corresponding to a time delay of even number of stages;

c. pre-computing an estimated ISI term for all Viterbi states using the relation $$I_n = \sum_{m=1}^{L} I_{n-m} * x_m,$$

where n is the stage for which the estimated ISI term is being calculated, $I_n$ is the transmitted MSK symbol corresponding to stage n, and $x_m$ is the autocorrelation value of the channel impulse response for the time delay of m stages obtained at step (a) and (b);

d. advancing the Viterbi trellis by a stage in the forward time direction for estimating the transmitted MSK symbols of the first data set, the step of advancing the Viterbi trellis by a stage, the advancing comprising the steps of:

if the transmitted MSK symbol corresponding to the stage is real then performing steps of:

1. pre-processing the received symbol at the stage to obtain a real component representing the received symbol corresponding to the stage; and 2. determining the surviving path for only the first set of states at the stage, using the estimated ISI terms corresponding to the first set of states, the real component representing the received symbol corresponding to the stage and the path metrics of the surviving paths at the previous stage;

else performing the steps of:

3. pre-processing the received symbol at the stage to obtain an imaginary component representing the received symbol corresponding to the stage; and 4. determining the surviving path for only the second set of states at the stage, using the estimated ISI terms corresponding to the second set of states, the imaginary component representing the received symbol corresponding to the stage and the path metrics of the surviving paths at the previous stage;

if the transmitted MSK symbol corresponding to the stage is the last symbol of the data burst then performing the steps of:

1. selecting a first maximum likelihood path from the surviving paths at the stage; and 2. tracing back along the first maximum likelihood path to identify the symbols on the first maximum likelihood path as the transmitted MSK symbols of the first data set; and e. advancing the Viterbi trellis by a stage in the backward time direction for estimating the transmitted MSK symbols of the second data set, the step of advancing the Viterbi trellis by a stage, the advancing comprising the steps of:

if the transmitted MSK symbol corresponding to the stage is real then performing steps of:

1. pre-processing the received symbol at the stage to obtain a real component representing the received symbol corresponding to the stage; and 2. determining the surviving path for only the first set of states at the stage, using the estimated ISI terms corresponding to the second set of states, the real component representing the received symbol corresponding to the stage and the path metrics of the surviving paths at the previous stage;

else performing the steps of:

1. pre-processing the received symbol at the stage to obtain an imaginary component representing the received symbol corresponding to the stage; and 2. determining the surviving path for only the second set of states at the stage, using the estimated ISI terms corresponding to the first set of states, the imaginary component representing the received symbol corresponding to the stage and the path metrics of the surviving paths at the previous stage;

if the transmitted MSK symbol corresponding to the stage is the first symbol of the data burst then performing the steps of:

1. selecting a second maximum likelihood path from the surviving paths at the stage; and 2. tracing back along the second maximum likelihood path to identify the symbols on the second maximum likelihood path as the transmitted MSK symbols of the second data set.

17. The method as recited in claim 1 wherein one or more of the steps are embodied in a computer program product.

18. The method as recited in claim 16 wherein one or more of the steps are embodied in a computer program product.

19. A system for equalizing an MSK symbol at a wireless receiver using a Viterbi algorithm, the transmitted MSK symbols being alternately real and imaginary, the Viterbi states possible at the stages corresponding to real symbols constituting a first set of states, the Viterbi states possible at the stages corresponding to imaginary symbols constituting a second set of states, the system comprising:

a. means for obtaining only the imaginary parts of the autocorrelation values of the channel impulse response corresponding to a time delay of odd number of stages;
  b. means for obtaining only the real parts of the autocorrelation values of the channel impulse response corresponding to a time delay of even number of stages;
  c. means for pre-computing an estimated ISI term for all Viterbi states using the real and imaginary parts of the autocorrelation values; and
  d. a Viterbi equalizer advancing the Viterbi trellis by a stage, the Viterbi equalizer comprising:
    i. a pre-processor pre-processing the received symbol at the stage to optionally obtaining a real and an imaginary component representing the received symbol depending on a control signal
    ii. an add-compare-select unit determining the surviving path optionally for the first set of states and the second set of states depending on the control signal, using the pre-computed estimated ISI terms, the real or imaginary component obtained by the pre-processor, and the path metrics of the surviving paths at the previous stage;
    iii. a control unit generating a control signal to the pre-processor and the add-compare-select unit depending on the transmitted MSK symbol being real or imaginary; and
    iv. means for estimating at least one transmitted MSK symbol using the surviving paths at the stage.

20. The system as recited in claim 19 wherein the means for estimating a transmitted MSK symbol using the surviving paths at the stage comprises:
  a. means for selecting a maximum likelihood path from the surviving paths determined by the add-compare-select unit; and
  b. means for analyzing the maximum likelihood path to estimate at least one transmitted MSK symbol.

21. The system as recited in claim 20 wherein the means for analyzing the maximum likelihood path to estimate at least one transmitted MSK symbol comprises means for tracing back along the maximum likelihood path to a previous stage to estimate the transmitted MSK symbol at the previous stage.

22. The system as recited in claim 20 wherein the means for analyzing the maximum likelihood path to estimate at least one transmitted MSK symbol comprises means for tracing back along the maximum likelihood path to estimate the transmitted MSK symbols at all stages being traced back.

23. The system as recited in claim 19 wherein the add-compare-select unit comprises:
  a. means for obtaining the path metric of a possible path leading to a state at a stage, using the pre-computed estimated ISI terms, the real and imaginary component representing the received symbol obtained by the pre-processor, and the path metric of the surviving path for the state at the previous stage on the possible path.
  b. means for selecting the path having greater path metric as the survivor path for the state at the stage.

24. The system as recited in claim 20 wherein means for selecting a maximum likelihood path from the surviving paths comprises means for selecting the surviving path with maximum path metric.

25. The system as recited in claim 19 wherein the Viterbi equalizer comprises a path memory storing the path metrics of the surviving paths at a stage.

26. The system as recited in claim 19 further comprising a look-up table storing the pre-computed estimated ISI term for all Viterbi states.

27. The system as recited in claim 26 wherein the Viterbi equalizer comprises means for advancing the stages in the reverse time direction using the pre-computed estimated ISI terms stored in the look-up table.

* * * * *